US00RE50129E

(19) United States
(12) Reissued Patent
Park et al.

(10) Patent Number: US RE50,129 E
(45) Date of Reissued Patent: Sep. 17, 2024

(54) STORAGE DEVICE HAVING VARIOUS RECOVERY METHODS AND RECOVERY MODES

(71) Applicant: SAMSUNG ELECTRONICS CO., LTD., Suwon-si (KR)

(72) Inventors: Ji Hyung Park, Yongin-si (KR); HyunJung Shin, Yongin-si (KR); Isaac Baek, Hwaseong-si (KR); Jeonguk Kang, Bucheon-si (KR); Minseok Ko, Seoul (KR)

(73) Assignee: SAMSUNG ELECTRONICS CO., LTD., Suwon-si (KR)

(21) Appl. No.: 17/501,403

(22) Filed: Oct. 14, 2021

Related U.S. Patent Documents

Reissue of:
(64) Patent No.: 10,445,200
Issued: Oct. 15, 2019
Appl. No.: 15/651,342
Filed: Jul. 17, 2017

U.S. Applications:
(63) Continuation-in-part of application No. 15/481,781, filed on Apr. 7, 2017, now Pat. No. 10,372,558.

(30) Foreign Application Priority Data

May 2, 2016 (KR) ..... 10-2016-0054113
May 2, 2017 (CN) ..... 201710301025.9

(51) Int. Cl.
*G06F 11/00* (2006.01)
*G06F 11/07* (2006.01)
(Continued)

(52) U.S. Cl.
CPC ..... *G06F 11/0751* (2013.01); *G06F 11/0727* (2013.01); *G06F 11/2094* (2013.01);
(Continued)

(58) Field of Classification Search
CPC ..... G06F 11/0751; G06F 11/2094; G06F 11/0727; G06F 11/0775; G06F 2201/81;
(Continued)

(56) References Cited

U.S. PATENT DOCUMENTS 6,038,679 A 3/2000 Hanson
6,487,677 B1 11/2002 Jantz et al.
(Continued)

FOREIGN PATENT DOCUMENTS

CN 103019873 4/2013
CN 103093818 5/2013
(Continued)

OTHER PUBLICATIONS

Office Action issued in corresponding U.S. Appl. No. 15/481,781 dated Nov. 19, 2018.
(Continued)

*Primary Examiner* — Matthew E Heneghan
(74) *Attorney, Agent, or Firm* — F. CHAU & ASSOCIATES, LLC

(57) ABSTRACT

A storage device including: a nonvolatile memory device including a plurality of nonvolatile memory cells, a partial storage area and an overprovision storage area; and a controller configured to control the nonvolatile memory device, wherein when the controller detects a fault of the nonvolatile memory device, the controller negates the partial storage area, reassigns the overprovision storage area, which corresponds to a size of a user area, among the partial storage area, determines a device fail if the overprovision storage area is less than an overprovision threshold after the reassigning of the partial storage area, and determines a recovery success if the overprovision storage area is equal to or greater than the overprovision threshold after the reassigning of the partial storage area.

12 Claims, 22 Drawing Sheets

(51) Int. Cl.
*G06F 11/20* (2006.01)
*G11C 29/00* (2006.01)
*G11C 29/44* (2006.01)

(52) U.S. Cl.
CPC ..... *G11C 29/44* (2013.01); *G11C 29/88* (2013.01); *G11C 29/883* (2013.01); *G06F 11/0775* (2013.01); *G06F 2201/805* (2013.01); *G06F 2201/81* (2013.01)

(58) Field of Classification Search
CPC ... G06F 2201/805; G11C 29/88; G11C 29/44; G11C 29/883; G11C 29/76
See application file for complete search history.

(56) References Cited

U.S. PATENT DOCUMENTS

| | | | | |
|---|---|---|---|---|
| 7,526,675 | B2 | 4/2009 | Mambakkam et al. | |
| 7,962,807 | B2 | 6/2011 | Nakamura | |
| 8,041,916 | B2 | 10/2011 | Nam | |
| 8,041,991 | B2 | 10/2011 | McKean | |
| 8,065,492 | B2 | 11/2011 | Moshayedi | |
| 8,151,137 | B2 * | 4/2012 | McKean | G06F 12/0246 714/6.13 |
| 8,201,024 | B2 | 6/2012 | Burger et al. | |
| 8,214,580 | B2 * | 7/2012 | Lucas | G06F 3/0616 711/103 |
| 8,812,933 | B2 | 8/2014 | Joo et al. | |
| 9,081,753 | B2 | 7/2015 | Paleologu et al. | |
| 9,213,598 | B2 | 12/2015 | Seo et al. | |
| 9,229,854 | B1 | 1/2016 | Kuzmin et al. | |
| 9,244,766 | B2 | 1/2016 | Patapoutian et al. | |
| 9,268,487 | B2 * | 2/2016 | Gibbons | G06F 3/0616 |
| 9,697,071 | B2 | 7/2017 | Finnigan et al. | |
| 9,728,277 | B2 | 8/2017 | Lee et al. | |
| 9,812,224 | B2 | 11/2017 | Yun | |
| 10,372,558 | B2 | 8/2019 | Park et al. | |
| 10,445,200 | B2 | 10/2019 | Park et al. | |
| 2005/0044454 | A1 * | 2/2005 | Moshayedi | G06F 11/004 714/54 |
| 2011/0083047 | A1 | 4/2011 | Stenfort | |
| 2012/0017116 | A1 | 1/2012 | Matsuyama et al. | |
| 2012/0089767 | A1 | 4/2012 | Lee et al. | |
| 2013/0173954 | A1 * | 7/2013 | Woo | G06F 11/167 714/6.13 |
| 2013/0297968 | A1 | 11/2013 | Yi | |
| 2014/0258587 | A1 | 9/2014 | Baryudin et al. | |
| 2015/0033065 | A1 | 1/2015 | Canepa et al. | G06F 11/1008 714/6.11 |
| 2015/0332772 | A1 | 11/2015 | Kim et al. | |
| 2016/0011930 | A1 | 1/2016 | Yeh | |
| 2016/0062666 | A1 * | 3/2016 | Samuels | G06F 3/0616 711/103 |
| 2016/0117104 | A1 * | 4/2016 | Hashimoto | G11C 29/883 711/171 |
| 2017/0315879 | A1 | 11/2017 | Park et al. | |
| 2017/0315891 | A1 | 11/2017 | Park et al. | |
| 2017/0371780 | A1 * | 12/2017 | Hashimoto | G06F 12/0246 |

FOREIGN PATENT DOCUMENTS

| | | |
|---|---|---|
| CN | 105097034 | 11/2015 |
| CN | 105229615 | 1/2016 |
| JP | H09198884 | 7/1997 |
| JP | 2007079762 | 3/2007 |
| JP | 2009015553 | 1/2009 |
| JP | 2013149112 | 8/2013 |
| JP | 2013175118 | 9/2013 |
| JP | 2015118664 | 6/2015 |
| KR | 10-2013-0124010 | 11/2013 |
| KR | 10-2014-0103756 | 8/2014 |
| KR | 10-1554550 | 9/2015 |
| KR | 10-2016-0016422 | 2/2016 |
| KR | 20160044289 | 4/2016 |

OTHER PUBLICATIONS

Office Action issued in corresponding U.S. Appl. No. 15/651,342 dated Jan. 18, 2019.
Fan et al. "Transaction Recovery Model of Databases Based on PCM and Flash Memory", Chinese Journal of Computers, vol. 36 No. 8, Aug. 2013, pp. 1582-1591.
Monazzah et al., "FTSPM: A Fault-Tolerant ScratchPad Memory", IEEE, 2013, 10 pages.

* cited by examiner

| |
|---|
| Types of fault |
| Level of fault |
| Size of storage area of fault |
| Address of storage area of fault |
| Physical feature of storage area of fault |
| History of fault |

STORAGE DEVICE HAVING VARIOUS RECOVERY METHODS AND RECOVERY MODES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This U.S. non-provisional application is a continuation-in-part of U.S. application Ser. No. 15/481,781 filed on Apr. 7, 2017 which claims priority under 35 U.S.C. § 119 to Korean Patent Application No. 10-2016-0054113 filed May 2, 2016, in the Korean Intellectual Property Office, the disclosures of which are incorporated by reference herein in their entireties. This U.S. non-provisional application also claims priority under 35 U.S.C. § 119 to Chinese Patent Application No. 201710301025.9 filed May 2, 2017 in the Chinese Patent Office, the disclosure of which is incorporated by reference herein in its entirety.

TECHNICAL FIELD

Exemplary embodiments of the inventive concept described herein relate to a semiconductor device, and more particularly, to a storage device having various recovery methods and various recovery modes.

DISCUSSION OF RELATED ART

A storage device may refer to a device that stores data under control of a host device such as a computer, a smartphone, or a smart pad. The storage device may include a device, which stores data on a magnetic disk, such as a hard disk drive (HDD). The storage device may also include a device, which stores data on a semiconductor memory, in particular, a nonvolatile memory, such as a solid state drive (SSD) or a memory card.

The nonvolatile memory may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM). RAM may refer to a random access memory.

High-end storage devices with high capacity and high performance are being researched and developed. Manufacturing costs of high-end storage devices are higher than general storage devices. If a high-end storage device is defective, it costs a lot to replace.

SUMMARY

An exemplary embodiment of the inventive concept provides a storage device including: a nonvolatile memory device including a plurality of nonvolatile memory cells, a partial storage area and an overprovision storage area; and a controller configured to control the nonvolatile memory device, wherein when the controller detects a fault of the nonvolatile memory device, the controller negates the partial storage area, reassigns the overprovision storage area, which corresponds to a size of a user area, among the partial storage area, determines a device fail if the overprovision storage area is less than an overprovision threshold after the reassigning of the partial storage area, and determines a recovery success if the overprovision storage area is equal to or greater than the overprovision threshold after the reassigning of the partial storage area.

An exemplary embodiment of the inventive concept provides a storage device including: a nonvolatile memory device including a plurality of nonvolatile memory cells; and a controller configured to control the nonvolatile memory device, wherein when the controller detects a fault of the nonvolatile memory device, the controller selects a recovery method among a plurality of recovery methods, and recovers the fault using the selected recovery method.

An exemplary embodiment of the inventive concept provides a storage device including: a nonvolatile memory device including a plurality of nonvolatile memory cells; and a controller configured to control the nonvolatile memory device, wherein when the controller detects a fault of the nonvolatile memory device, the controller detects a recovery mode upon detecting the fault, selects a recovery method and performs a recovery of the fault itself if the recovery mode is a first recovery mode, and queries the recovery method to an external host device if the recovery mode is a second recovery mode.

BRIEF DESCRIPTION OF THE FIGURES

The above and other features of the inventive concept will become more apparent by describing in detail exemplary embodiments thereof with reference to the following figures, in which.

Like reference numerals refer to like elements in the figures unless otherwise noted.

DETAILED DESCRIPTION OF THE EMBODIMENTS

Figure 1:
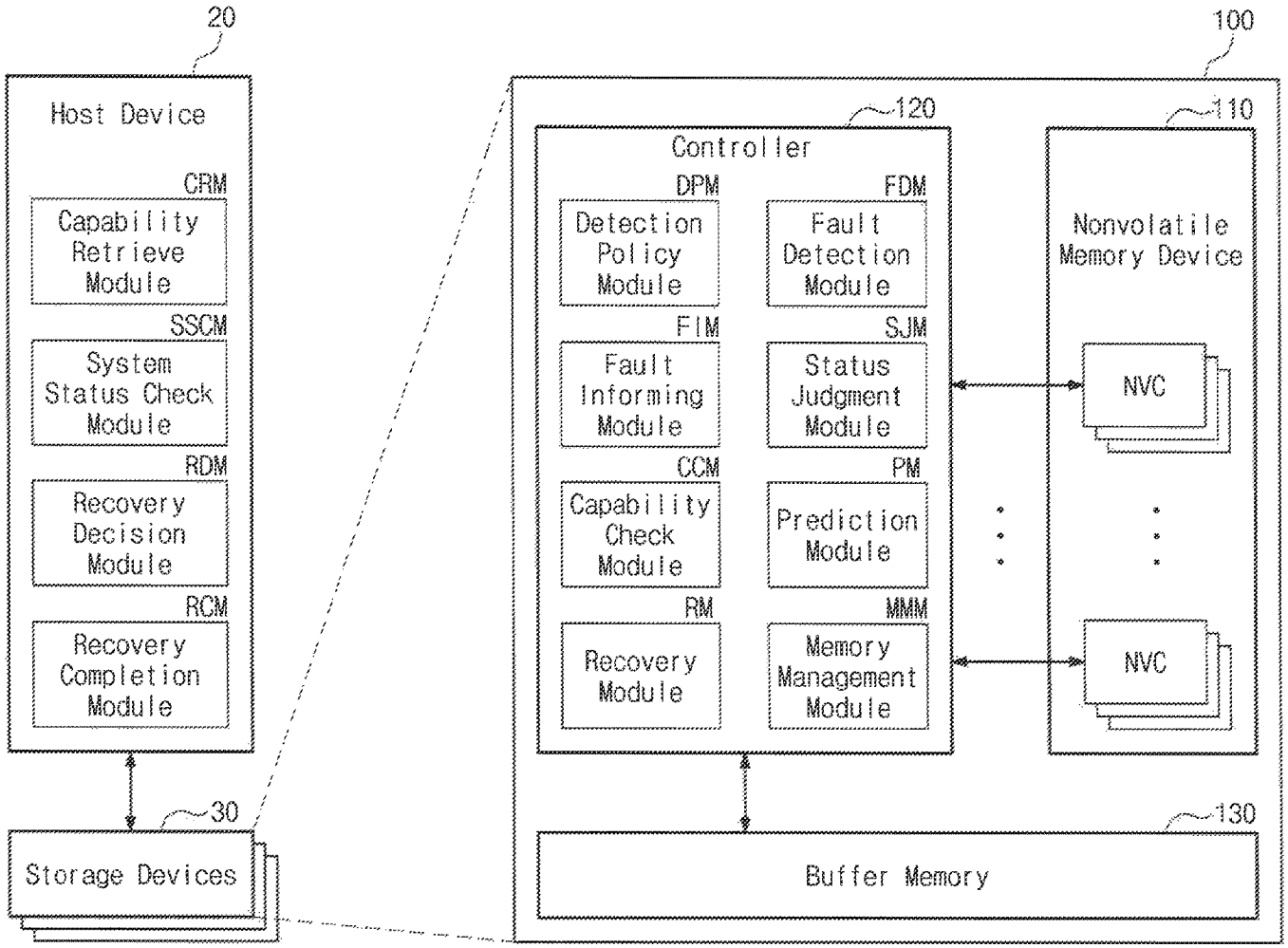
FIG. 1 is a block diagram illustrating a computing device according to an exemplary embodiment of the inventive concept.

FIG. 1 is a block diagram illustrating a computing device 10 according to an exemplary embodiment of the inventive concept. Referring to FIG. 1, the computing device 10 includes a host device 20, storage devices 30, and a storage device 100.

The host device 20 may write data to the storage devices 30, read data from the storage devices 30, and erase data from the storage devices 30.

The storage devices 30 may include a hard disk drive, a solid state drive, etc. The storage devices 30 may include homogeneous or heterogeneous storage devices. The storage device 100 separately illustrated in FIG. 1 is an example of one of the storage devices 30.

The storage device 100 may be a solid state drive. The storage device 100 includes a nonvolatile memory device 110, a controller 120, and a buffer memory 130.

The nonvolatile memory device 110 may include a plurality of nonvolatile memory chips NVC. The nonvolatile memory chips NVC may communicate with the controller 120 through two or more channels (indicated by arrows in FIG. 1). For example, two or more nonvolatile memory chips NVC may be connected to one channel. Nonvolatile memory chips NVC connected to different channels may communicate with the controller 120 in parallel with each other.

The controller 120 may be configured to control the nonvolatile memory device 110 and the buffer memory 130. The controller 120 may control a program operation, a read operation, and an erase operation of the nonvolatile memory device 110. The controller 120 may temporarily store data, which it exchanges with the nonvolatile memory device 110, in the buffer memory 130. The controller 120 may use the buffer memory 130 as a working memory that stores codes or metadata. For example, the buffer memory 130 may include a volatile or nonvolatile random access memory (RAM).

In general, the controller 120 may divide a storage space of the nonvolatile memory device 110 into a user area and a reserved area. The user area may be recognized by the host device 20. For example, the controller 120 may notify the host device 20 of a storage capacity of the user area as a storage capacity of the storage device 100. The host device 20 may assign logical addresses to the user area. The controller 120 may map the logical addresses assigned by the host device 20 to physical addresses of the user area of the nonvolatile memory device 110.

When the user area is unavailable due to deterioration, wear-out, or damage to a portion thereof, the controller 120 may determine that a fault (e.g., a local fault) is present in a particular portion of the user area. The controller 120 may negate the portion of the user area at which the fault is detected and reassign a portion of the reserved area as the user area. The reassignment may make it possible to maintain the entire storage capacity of the user area.

If all of the reserved area is used, even though a fault is generated at a particular portion (again, a local fault) of the user area, the controller 120 cannot use the reserved area for a reassignment. If the local fault is generated after all the reserved area is used, the controller 120 may determine that a global fault has occurred. In the event of a global fault, a conventional storage device enters a device fail state where the storage device can no longer be used.

However, the storage device 100 according to an exemplary embodiment of the inventive concept may prevent the storage device 100 from entering the device fail state when there is no reserved area left and a local fault occurs. For example, in a case in which the global fault traditionally occurs, the storage device 100 may perform a recovery operation to treat the global fault as a local fault. For example, during the recovery operation, the controller 120 may prohibit an access to a storage space at which a fault is generated and set the storage device 100 such that the storage device 100 operates with the remaining storage space. Accordingly, the life cycle of the storage device 100 may be extended, and costs associated with operating the storage device 100 may be reduced.

With regard to the above-described recovery operation, the host device 20 may include a capability retrieve module CRM, a system status check module SSCM, a recovery decision module RDM, and a recovery completion module RCM. The capability retrieve module CRM may retrieve information about recovery capabilities that the storage device 100 supports. The system status check module SSCM may collect information about a status or resource of the host device 20. The recovery decision module RDM may select a recovery scheme. The recovery completion module RCM may control settings of the host device 20 such that the storage device 100 is driven normally after completion of the recovery operation. The recovery completion module RCM may also control settings of the storage device 100 to perform an additional recovery such as data recovery for the host device 20.

With regard to the above-described recovery operation, the controller 120 may include a detection policy module DPM, a fault detection module FDM, a fault informing module FIM, a status judgment module SJM, a capability check module CCM, a prediction module PM, a recovery module RM, and a memory management module MMM. The detection policy module DPM may store information about a fault detection policy of the controller 120. In other words, on which basis the controller 120 detects a fault. The fault detection module FDM may detect whether a fault (a local fault or a global fault) is generated at the elements of the storage device 100, for example, the nonvolatile memory device 110, the controller 120, or the buffer memory 130. The fault informing module FIM may inform the host device 20 of information about the detected fault, for example, the global fault. The status judgment module SJM may determine a fault status. The capability check module CCM may store information about recovery schemes that the controller 120 supports. The prediction module PM may predict how the performance of the storage device 100, for example, an operating speed and a capacity, vary when each recovery scheme is performed. The recovery module RM may perform recovery based on the selected recovery scheme. The memory management module MMM may manage the nonvolatile memory device 110. For example, the memory management module MMM may manage mapping information between logical addresses assigned by the host device 20 and physical addresses of the nonvolatile memory device 110. The memory management module MMM may update the mapping information based on the recovery result.

Operations of modules associated with the recovery operation will be described later with reference to accompanying drawings.

The modules of the host device 20 or the controller 120 illustrated in FIG. 1 are exemplary, and the inventive concept may not be limited thereto. In an exemplary embodiment of the inventive concept, at least one of the modules of the controller 120 or the host device 20 may be omitted. Two or more of the modules of the controller 120 or the host device 20 may be integrated into a single module. At least one of the modules of the controller 120 or the host device 20 may be divided into two or more sub-modules. Additionally, each of the modules may be implemented in hardware as a circuit.

In the following detailed description, exemplary embodiments of the inventive concept will be described under the condition that respective modules of the host device 20 and respective modules of the controller 120 communicate with each other. Respective modules of the host device 20 and respective modules of the controller 120 may communicate with each other by using a shared physical channel connecting the host device 20 and the storage device 100. For example, respective modules of the host device 20 may send information to respective modules of the controller 120 in the form of an application program interface (API), a command and an address or an argument associated with the command, a packet suitable for a shared channel, etc. The information transmitted from the host device 20 to the controller 120 may be referred to as a "request". Each module of the controller 120 may send a response to each module of the host device 20 in response to a request of each module of the host device 20.

Figure 2:
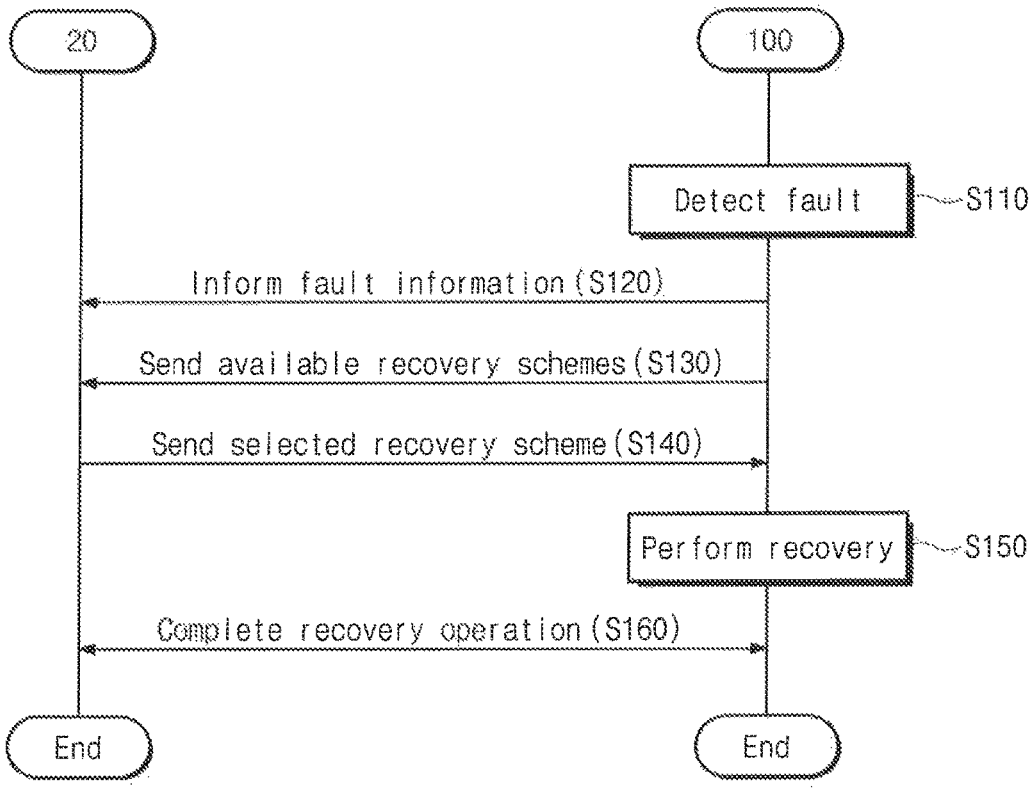
FIG. 2 is a flowchart illustrating an operating method of the computing device of FIG. 1 according to an exemplary embodiment of the inventive concept.

FIG. 2 is a flowchart illustrating an operating method of the computing device 10 of FIG. 1 according to an exemplary embodiment of the inventive concept. Referring to FIGS. 1 and 2, in operation S110, the storage device 100, for example, the controller 120 may detect a fault of the storage device 100, for example, a local fault (or a local fault causing a global fault). For example, the fault may be detected by the fault detection module FDM. The fault detection module FDM may perform fault detection based on a fault detection policy stored in the detection policy module DPM.

In operation S120, the storage device 100, for example, the controller 120 may notify the host device 20 of fault information. For example, the fault informing module FIM may collect the fault information and send the collected fault information to the host device 20.

In operation S130, the storage device 100, for example, the controller 120 may provide the host device 20 with available recovery schemes for recovering a fault. For example, the capability check module CCM may manage the available recovery schemes and provide them to the host device 20. For example, the capability check module CCM may provide the host device 20 or the capability retrieve module CRM of the host device 20 with the recovery schemes in response to a request of the capability retrieve module CRM. For example, the capability check module CCM may provide the host device 20 with one or more recovery schemes. The capability check module CCM may inform the host device 20 of all recovery schemes or those which are more suitable for recovering a current fault, from among all supportable recovery schemes.

In operation S140, the host device 20 may select one of the recovery schemes from the storage device 100. For example, the recovery scheme may be selected by the recovery decision module RDM. The recovery decision module RDM may provide the selected recovery scheme to the storage device 100, for example, the controller 120.

In operation S150, the storage device 100, for example, the controller 120 may perform a recovery operation based on the selected recovery scheme. The recovery operation may be performed by the recovery module RM.

In operation S160, the storage device 100 and the host device 20 may complete the recovery operation. The completion of the recovery operation may be performed by the recovery completion module RCM of the host device 20 and the memory management module MMM of the controller 120. For example, the recovery completion module RCM and the memory management module MMM may share information about the performance or resource of the storage device 100, which varies according to the recovery operation. If the recovery operation is completed, the host device 20 may normally access the storage device 100. While the storage device 100 performs the recovery operation, the storage device 100 may permit the host device 200 to access normal storage spaces at which the local fault is not generated. For example, the storage device 100 may permit reading and writing with respect to the normal storage spaces, prohibit the writing, permit the reading, or prohibit both the reading and the writing while permitting exchange of status information. For example, a permitted access level may be determined by the storage device 100 or the host device 20.

Figure 3:
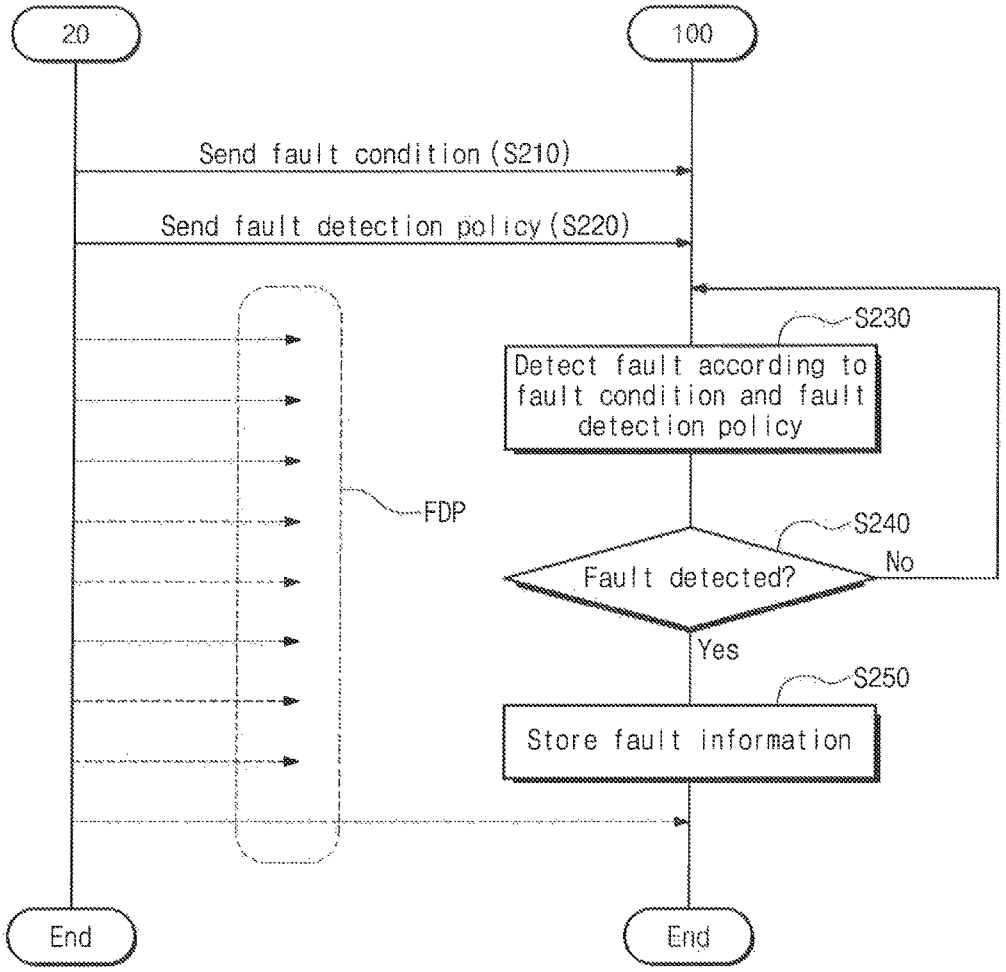
FIG. 3 is a flowchart illustrating a method in which a storage device detects a fault and informs fault information according to an exemplary embodiment of the inventive concept.

FIG. 3 is a flowchart illustrating a method in which the storage device 100 detects a fault (operation S110 of FIG. 2) and informs fault information (operation S120 of FIG. 2) according to an exemplary embodiment of the inventive concept. Referring to FIGS. 1 and 3, in operation S210, the host device 20 may send a fault condition to the storage device 100. For example, the host device 20 may send a condition determined as a fault to the fault detection module FDM of the controller 120. For example, operation S210 may be performed when the computing device 10 performs an initialization or power-on reset operation at power-on. If the fault detection module FDM is configured to detect a fault by using a previously stored default condition, operation S210 may be skipped.

In operation S220, the host device 20 may send a fault detection policy to the storage device 100. For example, the host device 20 may send a fault detection policy, which includes information about timing when fault detection is performed, to the detection policy module DPM of the controller 120. For example, operation S220 may be performed when the computing device 10 performs an initialization or power-on reset operation at power-on. If the detection policy module DPM is configured to detect a fault by using a previously stored default condition, operation S220 may be skipped.

After the detection condition and the fault detection policy are completely set, the host device 20 may perform fault detection polling (FDP). The fault detection polling (FDP) may include an operation in which the host device 20 periodically or frequently checks whether a fault is detected from the storage device 100. The host device 20 may perform the fault detection polling (FDP) as a background operation while normally performing a write, read, or erase operation with respect to the storage device 100. In an exemplary embodiment of the inventive concept, arrows, which are not connected to an operation flow of the storage device 100, illustrate the fault detection polling (FDP) when a fault is not detected.

While the host device 20 performs the fault detection polling (FDP), in operation S230, the storage device 100, for example, the controller 120 may detect a fault based on the fault condition and fault detection policy. For example, the fault detection may be performed by the fault detection module FDM. The fault detection may be performed as a background operation while the storage device 100 performs a write, read, or erase operation with respect to the nonvolatile memory device 110.

In operation S240, if the fault is not detected, the fault detection module FDM may continue to perform the fault detection (operation S230). If the fault is detected, operation S250 is performed.

In operation S250, the fault informing module FIM may collect and store fault information. Afterwards, the fault informing module FIM may send the fault information to the host device 20 in response to the first performed fault detection polling (FDP). Arrows, which are connected to the operation flow of the storage device 100, illustrate the fault detection polling (FDP) after the fault is detected.

Figure 4:
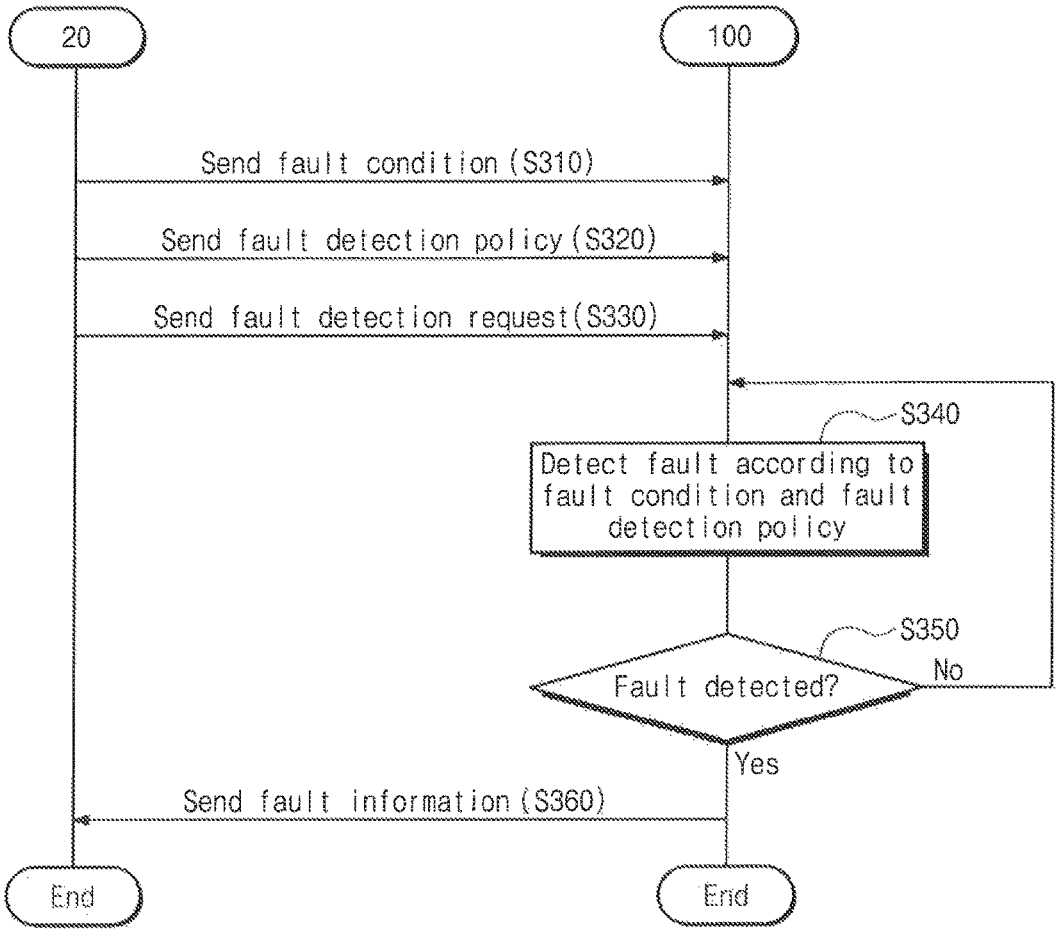
FIG. 4 is a flowchart illustrating a method in which a storage device detects a fault and informs fault information according to an exemplary embodiment of the inventive concept.

FIG. 4 is a flowchart illustrating a method in which the storage device 100 detects a fault (operation S110 of FIG. 2) and informs fault information (operation S120 of FIG. 2) according to an exemplary embodiment of the inventive concept. Referring to FIGS. 1 and 4, in operation S310, the host device 20 may send a fault detection condition to the storage device 100. If the fault detection module FDM is configured to detect a fault by using a previously stored default condition, operation S310 may be skipped.

In operation S320, the host device 20 may send a fault detection policy to the storage device 100. If the detection policy module DPM is configured to detect a fault by using a previously stored default condition, operation S320 may be skipped.

After the detection condition and fault detection policy are completely set, in operation S330, the host device 20 may send a fault detection request to the storage device 100. For example, the fault detection request may not have a timeout condition until a response is received.

In operation S340, the storage device 100, for example, the controller 120 may detect a fault based on the fault condition and fault detection policy. For example, the fault detection may be performed by the fault detection module FDM. The fault detection may be performed as a background operation while the storage device 100 performs a write, read, or erase operation with respect to the nonvolatile memory device 110. For example, if the fault is not detected, the controller 120 performs scheduling such that a write, read, or erase request is performed prior to the fault detection request of operation S330.

In operation S350, if the fault is not detected, the fault detection module FDM may continue to perform the fault detection (operation S340). If the fault is detected, operation S360 is performed.

In operation S360, the fault informing module FIM may collect fault information. The fault informing module FIM may send the collected fault information to the host device 20 as a response to the fault detection request received in operation S330.

In an exemplary embodiment of the inventive concept, the storage device 100 may perform the fault detection by using a predefined fault detection condition or a fault detection condition controlled according to an internal determination of the storage device 100, without having to send the fault detection condition from the host device 20.

Figure 5:
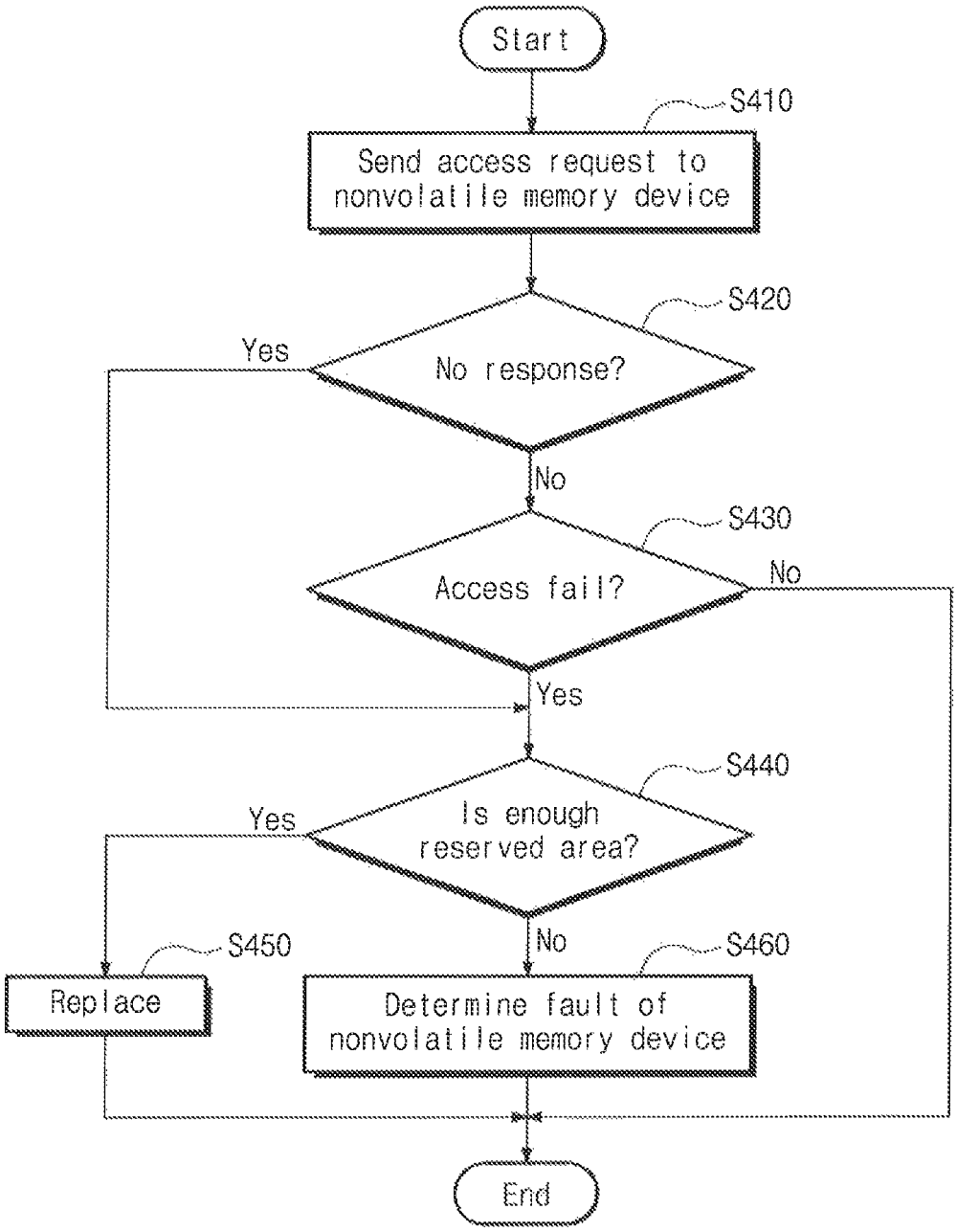
FIG. 5 is a flowchart illustrating a method in which a controller detects a fault according to an exemplary embodiment of the inventive concept.

FIG. 5 is a flowchart illustrating a method in which the controller 120 detects a fault (operation S110 of FIG. 2) according to an exemplary embodiment of the inventive concept. Referring to FIGS. 1 and 5, in operation S410, the controller 120 may send an access request to the nonvolatile memory device 110. For example, the controller 120 may send the access request to one of the nonvolatile memory chips NVC. The access request may include a write request, a read request, or an erase request.

In operation S420, if a response from a nonvolatile memory chip NVC to which the access request is sent, is absent, the fault detection module FDM may determine that a local fault is generated at the nonvolatile memory chip NVC. For example, in the case where a response is not received from a nonvolatile memory chip NVC, the fault detection module FDM may determine that the local fault is generated at the nonvolatile memory chip NVC or a package, a way, or a channel to which the nonvolatile memory chip NVC belongs. For example, fault detection may be performed with respect to nonvolatile memory chips NVC (or a package, a way, or a channel) physically associated with the nonvolatile memory chip NVC, or it may be determined that the local fault is generated at the associated nonvolatile memory chips NVC (or a package, a way, or a channel). Afterwards, operation S440 may be performed. If a response is received from the nonvolatile memory chip NVC to which the access request is sent, operation S430 is performed.

In operation S430, the fault detection module FDM may determine whether an access fails. For example, the access fail may be determined according to a fault condition.

For example, in the case where the access request is a write request, a program operation may be performed in a nonvolatile memory chip NVC. The program operation may include a plurality of program loops. Each program loop may include a program operation of increasing threshold voltages of memory cells by applying a program voltage thereto and a verification operation of determining whether the threshold voltages of the memory cells reach a target level. When the memory cells are not completely programmed until the program loop reaches the maximum program loop, or when the memory cells are completely programmed after the program loop is performed more than a predetermined number of times, the fault detection module FDM may determine that the write has failed. As another example, when the number of events that the memory cells are completely programmed after the program loop is performed above the predetermined threshold frequency and when the memory cells are programmed or erased is less than a threshold value, the fault detection module FDM may determine that the write has failed.

For example, in the case where the access request is a read request, a read operation may be performed in a nonvolatile memory chip NVC. When the number of errors detected from the read result is greater than or equal to a threshold value, the fault detection module FDM may determine that the read has failed. For example, when a time passing after data is written in memory cells is within a threshold time and the number of errors is greater than or equal to a threshold value (or the maximum number of correctable errors), the fault detection module FDM may determine that the read has failed.

For example, in the case where the access request is an erase request, an erase operation may be performed in a nonvolatile memory chip NVC. An erase operation may include a plurality of erase loops. Each program loop may include an erase operation of decreasing threshold voltages of memory cells by applying an erase voltage thereto and a verification operation of determining whether the threshold voltages of the memory cells reach a target level. When the memory cells are not completely erased until the erase loop reaches the maximum erase loop, or when the memory cells are completely erased after the erase loop is performed more than a predetermined number of times, the fault detection module FDM may determine that an erase has failed. As another example, when the number of events that the memory cells are completely erased after the erase loop is performed above the predetermined threshold frequency and when the memory cells are programmed or erased is less than a threshold value, the fault detection module FDM may determine that the erase has failed.

As described above, the access fail may be detected when fail probability is high as well as when a write, a read, or an erase fail is generated. The detect condition, which is used for the fault detection module FDM to determine the access fail may be stored in the fail detection module FDM and may be set by the host device 20. In an exemplary embodiment of the inventive concept, a characteristic of the detected fail may be tested by internal logic. The fail detection module FDM may again perform the fail detection based on the tested characteristic. For example, the fail detection module FDM may again perform the fail detection with respect to a greater storage space (e.g., a physical storage space distinguishable by a physical address) including a storage space at which a fail is detected. For example, the fault detection module FDM may again perform the fail detection based on units, by which various operations of the nonvolatile memory device 110 are performed, such as a memory block. For example, when a fail is detected from a memory cell, the fail detection may be again performed with respect to one or more pages including the fail memory cell or a memory block including the fail memory cell. When a fail is detected from a page, the fail detection may be again performed with respect to one or more pages including the fail page or a memory block including the fail page. As another example, the fail detection module FDM may determine that a greater storage space (e.g., a physical storage space distinguishable by a physical address) including a storage space, at which a fail is detected, fails based on the characteristic of the tested fail. For example, the determination of the fail may be performed according to units, by which various operations of the nonvolatile memory device 110 are performed, such as a memory block.

If the access fail is generated, the fault detection module FDM may determine that the local fault is generated. Afterwards, operation S440 is performed. If the access fail is not generated, the fault is not detected.

In operation S440, the memory management module MMM determines whether the reserved area is present. If the reserved area is sufficient, in other words, if a reserved area of a size corresponding to a size of a storage area at which a fault is generated is present, operation S450 is performed. In operation S450, the memory management module MMM may replace the storage area, at which the fault is generated, with the reserved area. For example, the memory management module MMM may release a mapping between physical addresses and logical addresses of the fault storage area. The memory management module MMM may map logical addresses of a fault area to physical addresses of the reserved area. In the case where the global fault is not detected because the local fault is detected but the reserved area is sufficient, the memory management module MMM may finally determine that a fault is not generated.

When the reserved area is not sufficient, in other words, in the case where a size of the fault storage area is greater than a size of the reserved area, operation S460 is performed. In operation S460, the fault detection module FDM may detect the global fault and finally determine that the fault is generated. Afterwards, as described with reference to operation S120 of FIG. 2, the fault informing module FIM may send the fault information to the host device 20.

In an exemplary embodiment of the inventive concept, the fault detection module FDM may detect a fault generated at any other element(s) of the storage device 100 as well as the nonvolatile memory device 110. For example, when the buffer memory 130 does not respond or when an access of the buffer memory 130 fails, the fault detection module FDM may determine that the global fault is generated. In addition, when a super capacitor or a tantalum capacitor is present in the storage device 100, the fault detection module FDM may receive a fail signal from an auxiliary power supply. In response to the fail signal, the fault detection module FDM may determine whether the global fault is generated. If the global fault is generated, the fault informing module FIM may send the fault information to the host device 20.

Figure 6:
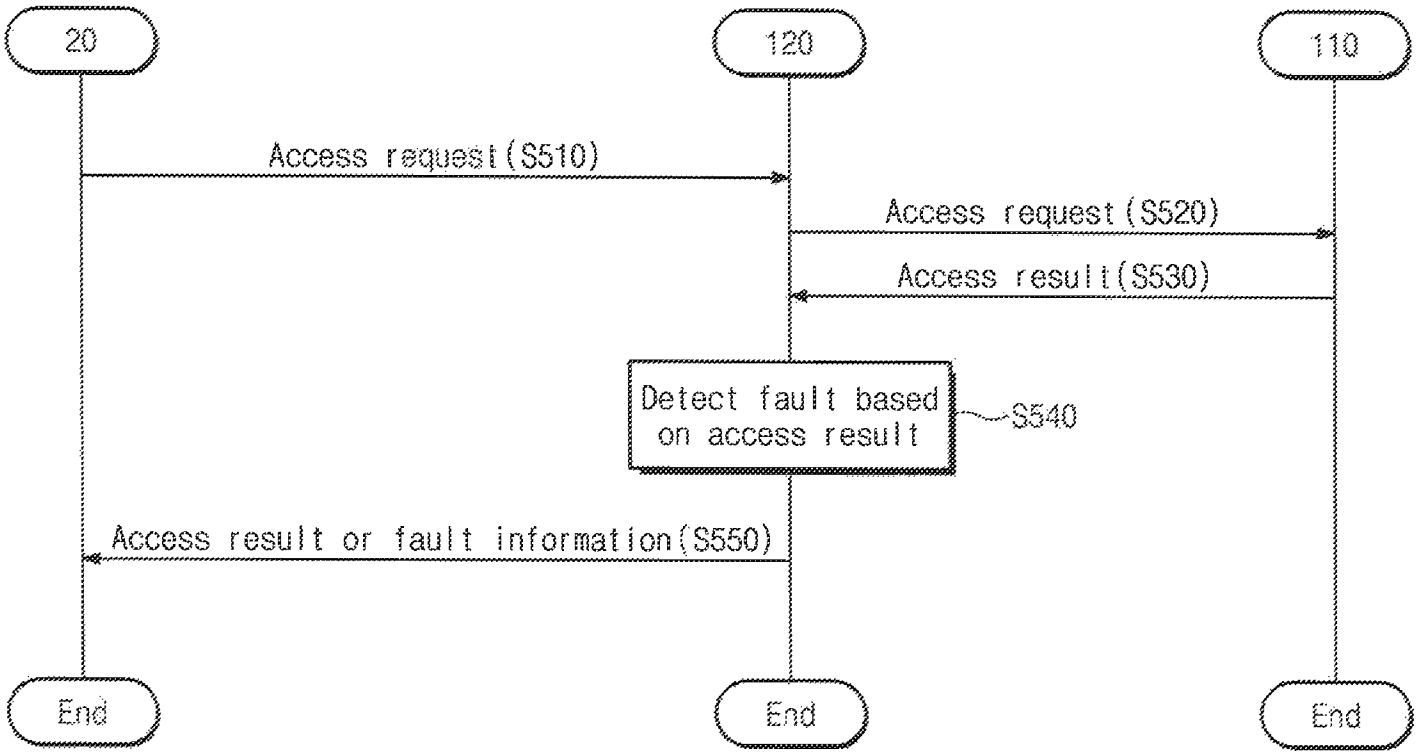
FIG. 6 illustrates a fault detection module detecting a fault based on a detection policy according to an exemplary embodiment of the inventive concept.

FIG. 6 illustrates the fault detection module FDM detecting a fault based on a detection policy according to an exemplary embodiment of the inventive concept. Referring to FIGS. 1 and 6, the fault detection module FDM may perform fault detection based on a direct detection policy set in the detection policy module DPM.

In operation S510, the host device 20 may send an access request to the controller 120.

In operation S520, the host device 20 may send the access request to the nonvolatile memory device 110 in response to the access request of the host device 20.

In operation S530, the controller 120 may receive the access result from the nonvolatile memory device 110.

In operation S540, the fault detection module FDM may perform fault detection based on the access result. For example, the fault detection module FDM may detect a fault depending on whether the nonvolatile memory device 110 does not respond, or if a read, a write, or an erase fail occurs.

In operation S550, the controller 120 may send the access result or fault information to the host device 20. For example, when the local fail or global fail does not occur or when a local fail occurs but a global fail does not occur, the controller 120 may send the access result to the host device 20. In the case where the global fail occurs, the controller 120 may provide the fault information to the host device 20.

In other words, the fault detection module FDM may perform the fault detection during an access performed by a request of the host device 20.

Figure 7:
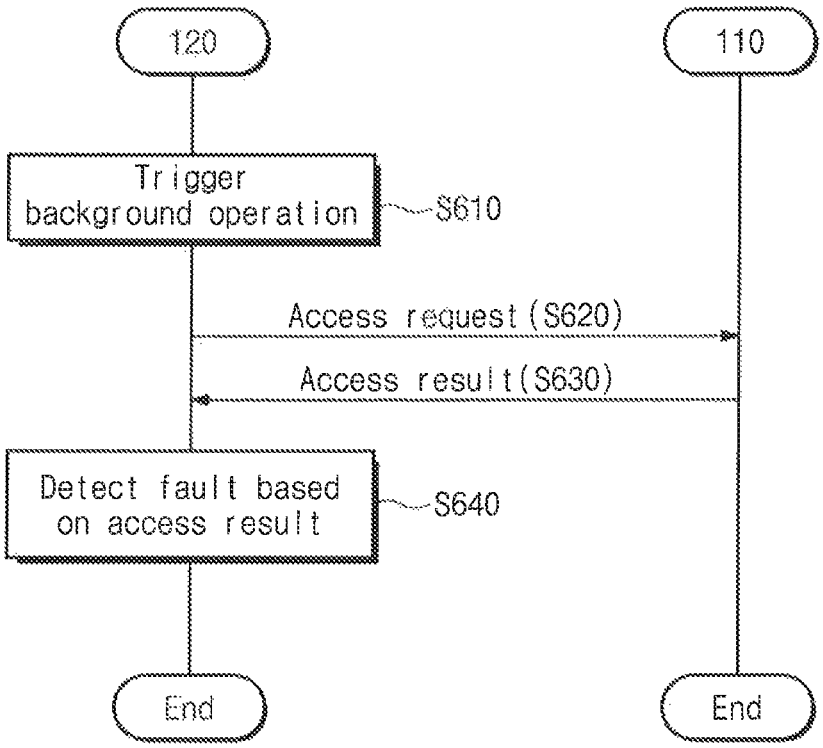
FIG. 7 illustrates a fault detection module detecting a fault based on a detection policy according to an exemplary embodiment of the inventive concept.

FIG. 7 illustrates the fault detection module FDM detecting a fault based on a detection policy according to an exemplary embodiment of the inventive concept. Referring to FIGS. 1 and 7, the fault detection module FDM may perform fault detection based on a background detection policy set to the detection policy module DPM.

In step S610, the controller 120 may trigger a background operation. For example, the background operation may be an operation in which the controller 120 or the memory management module MMM by itself accesses the nonvolatile memory device 110 to manage the nonvolatile memory device 110 without a request of the host device 20. The background operation may be performed during an idle time between operations that are performed according to a request of the host device 20. The background operation may include garbage collection, refresh (or read reclaim), wear leveling, etc. Here, the garbage collection may be performed to generate a free storage area by integrating valid data in used storage area to obtain a storage area that is filled with invalid data and erasing the obtained storage area. The refresh (or read reclaim) may be performed to increase the integrity of data by rewriting data of the low integrity in a free storage area, and the wear leveling may be performed to swap data in a storage area of a high wear-out level for data in a storage area of a low wear-out level.

In step S620, the controller 120 may send an access request to the nonvolatile memory device 110 based on the procedure of the background operation.

In step S630, the controller 120 may receive the access result from the nonvolatile memory device 110.

In operation S640, the controller 120 may detect a fault based on the access result.

In other words, the fault detection module FDM may perform the fault detection during an access that is performed by the controller 120 by itself without a request of the host device 20.

Figure 8:
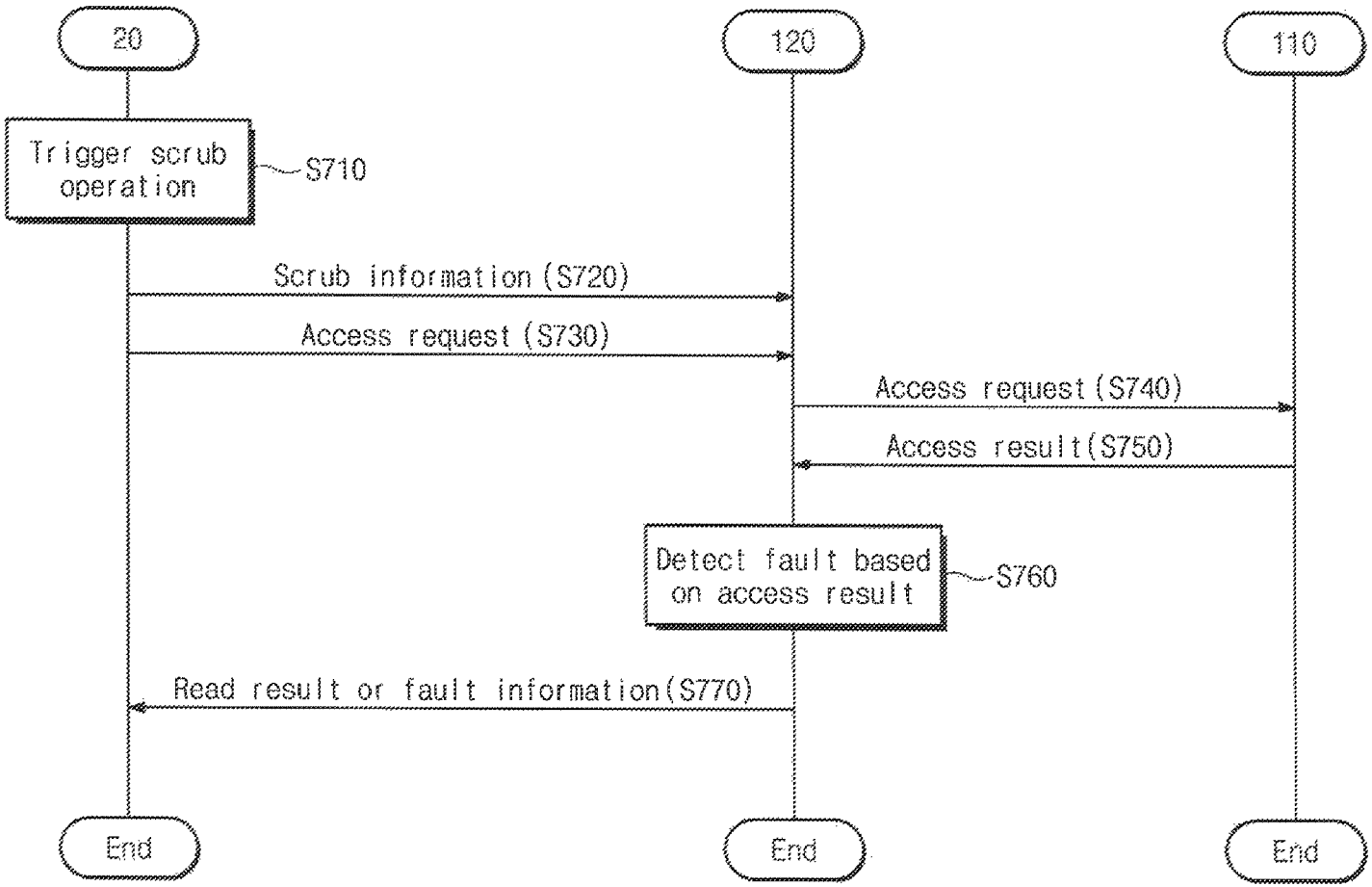
FIG. 8 illustrates a fault detection module detecting a fault based on a detection policy according to an exemplary embodiment of the inventive concept.

FIG. 8 illustrates the fault detection module FDM detecting a fault based on a detection policy according to an exemplary embodiment of the inventive concept. Referring to FIGS. 1 and 8, the fault detection module FDM may perform fault detection based on a scrub detection policy set in the detection policy module DPM.

In step S710, the controller 20 may trigger a scrub operation. For example, the scrub operation may be an operation in which the host device 20 scans data written in the storage devices 30 or the storage device 100 and checks integrity.

In operation S720, the host device 20 may send scrub information, which informs that the scrub operation begins, to the controller 120.

In operation S730, the host device 20 may send an access request to the controller 120 based on a predetermined sequence of the scrub operation.

In operation S740, the controller 120 may send the access request to the nonvolatile memory device 110 in response to the access request of the host device 20.

In operation S750, the controller 120 may receive the access result from the nonvolatile memory device 110.

In operation S760, the fault detection module FDM may perform fault detection based on the access result. For example, the fault detection module FDM may detect a fault depending on whether the nonvolatile memory device 110 does not respond, or if a read, a write, or an erase fail occurs.

In operation S770, the controller 120 may send the access result or fault information to the host device 20. For example, when the local fail or global fail does not occur or when a local fail occurs but a global fail does not occur, the controller 120 may send the access result to the host device 20. When the global fail occurs, the controller 120 may provide the fault information to the host device 20.

In other words, while the host device 20 performs the scrub operation, the fault detection module FDM may perform the fault detection during an access performed by a request of the host device 20.

As another example of the fault detection operation, the fault detection module FDM may perform fault detection based on an explicit detection policy set in the detection policy module DPM. For example, the host device 20 may notify the storage device 100 of execution of the scrub operation before performing the scrub operation. While the host device 20 accesses the storage device 100 as a part of the scrub operation, the storage device 100 may collect a fault detection result without sending it to the host device 20. If a scrub operation is completed, when an access is performed by a predetermined frequency, a predetermined time elapses, or a predetermined checkpoint (e.g., a checkpoint determined on a sequence of the scrub operation) arrives, the storage device 100 may notify the host device 20 of the collected fault detection result.

For example, the host device 20 may request the storage device 100 to perform explicit detection with respect to a portion of a storage space of the storage device 100 instead of the entire storage space of the storage device 100. For example, the storage device 100 may not perform the fault detection while the host device 20 performs the scrub operation with respect to a storage space to which the fault detection is not requested. While the host device 20 performs the scrub operation with respect to a storage space to which the fault detection is not requested, the storage device 100 may perform the fault detection and collect the fault detection result.

For example, the scrub operation may include a read operation that is performed with respect to a storage space where data is stored. The scrub operation may include a write operation of writing dummy data in a storage space where data is not stored. The scrub operation may include an erase operation that is performed with respect to a storage space where invalid data is stored.

As another example of the fault detection operation, the fault detection module FDM may perform fault detection based on a request detection policy set in the detection policy module DPM. For example, the fault detection module FDM may determine a storage space, of which a probability of fault occurrence is greater than or equal to a threshold value, based on an access result obtained when the host device 20 accesses the storage device 100 or the result of a fault detection performed by the fault detection module FDM. The fault detection module FDM may inform the host device 20 of information about the determined storage space. If the host device 20 requests the storage device 100 to perform the fault detection, the fault detection module FDM may perform the fault detection.

In an exemplary embodiment of the inventive concept, the detection policy module DPM may include all the fault policies that are described with reference to FIGS. 6 to 8. Policies, which are to be enabled, from among the detection policies, which the detection policy module DPM supports, may be selected by the host device 20. For example, the direct detection policy of FIG. 6 and the background detection policy of FIG. 7 may be enabled at the same time. In an exemplary embodiment of the inventive concept, a detection policy of the detection policy module DPM may be changed by the host device 20. For example, the host device 20 may select the direct detection policy as a default policy. If a fault is detected once or by a predetermined frequency, the host device 20 may change the detection policy into at least one of the background detection policy, the scrub detection policy, and the explicit detection policy or may further enable at least one policy thereof. If a fault is not detected during a predetermined time after the detection policy is changed, the host device 20 may reset the detection policy to the direct detection policy. In an exemplary embodiment of the inventive concept, the detection policy may be changed under control of the host device 20 or may be changed by a request of the storage device 100 or when the host device 20 permits changing the detection policy.

Figures 9, 10:
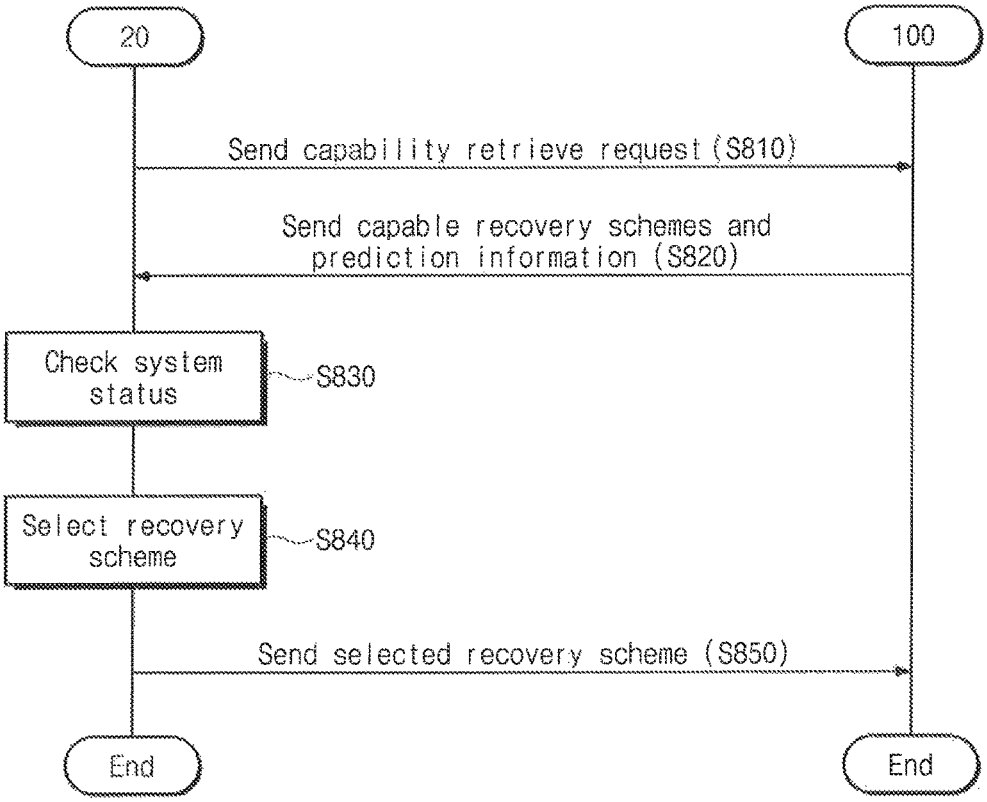
FIG. 9 illustrates fault information that a fault informing module sends according to an exemplary embodiment of the inventive concept.
FIG. 10 illustrates a host device retrieving one or more recovery schemes and selecting one of the obtained recovery schemes according to an exemplary embodiment of the inventive concept.

FIG. 9 illustrates fault information that the fault informing module FIM sends (operation S120 of FIG. 2) according to an exemplary embodiment of the inventive concept. Referring to FIGS. 1 and 9, fault information may include types of fault. For example, the types of fault may indicate a kind of local fail causing a global fail, such as no response, a write fail, a read fail, and an erase fail.

The fault information may further include a level of fault. For example, the level of fault may include how serious the fault is. In an exemplary embodiment of the inventive concept, the fault detection module FDM may perform fault detection based on a plurality of conditions. For example, when a write or erase fail is detected, the fault detection module FDM may make a fault level low if a program or erase operation is completed after a program or erase loop is performed above a threshold value. When a write or erase fail is detected, the fault detection module FDM may make a fault level high if a program or erase operation is not completed even though a program or erase loop is performed above a threshold value.

For example, when a read fail is detected, the fault detection module FDM may set a fault level based on whether a time passing after data is written in a memory cells belongs to a particular range, whether the number of errors belongs to a particular range, or whether an uncorrectable error is generated.

For example, the fault detection module FDM may set a fault level, based on an occurrence history of a global fault. For example, a user area of the nonvolatile memory device 110 may be divided into a plurality of zones. The fault detection module FDM may determine a fault level for each zone, based on the number of times that the global fault occurs.

The fault information may further include a size of a storage area where a fault is generated. The fault information may further include an address of a storage area where a fault is generated, for example, a physical address or logical address thereof.

The fault information may further include a physical characteristic (e.g., feature) of a storage area where a fault is generated. For example, in the case where a fault is generated at interconnections, for example, bit lines or word lines instead of memory cells of the nonvolatile memory device 110, information about the bit lines or word lines, where the fault is generated, may be included in the fault information.

The fault information may further include a fault history. For example, a list of logical addresses or physical addresses, where a fault is generated, may be included in the fault information.

For example, when the capability check module CCM sends available recovery schemes to the host device 20 (operation S130 of FIG. 2), it may select some of the recovery schemes supported by the controller 120. The capability check module CCM may provide the host device 20 with the selected recovery schemes as recommended recovery schemes.

FIG. 10 illustrates the host device 20 retrieving one or more recovery schemes (operation S130 of FIG. 2) and selecting one of the obtained recovery schemes. Referring to FIGS. 1 and 10, in operation S810, the host device 20 may send a capability retrieve request to the storage device 100. For example, the capability retrieve request may be generated and provided by the capability retrieve module CRM.

In operation S820, the storage device 100 may send available recovery schemes and prediction information to the host device 20. For example, the available recovery schemes may include all or some of the recovery schemes supported by the controller 120. For example, each recovery scheme may be provided together with information of one (or two) or more recovery ranges. For example, the recovery range may be presented in the form of a wide storage area including a storage area, at which a fault is generated, and a storage area physically adjacent thereto. The available recovery schemes may be provided by the capability check module CCM.

The prediction information may include a characteristic of the storage device 100 that varies when each recovery scheme is selected. For example, the prediction information may include a performance (or speed) variation of the storage device 100 after the recovery operation, a capacity variation of the storage device 100 after the recovery operation, a life cycle variation of the storage device 100 after the recovery operation, or a time needed to perform the recovery operation, when each recovery scheme and a recovery range associated with each recovery scheme are selected. In addition, information about changed specifications among specifications initially provided by the storage device 100 may be included in the prediction information. The prediction information may be provided by the prediction module PM.

In step S830, the host device 20 may check a system status. For example, the host device 20 may include the number of spare storage devices 30 associated with the host device 20, a ratio of used resources to unused resources of the host device 20, the number of times that the host device 20 is called by external client devices, the number of times that the host device 20 accesses the storage device 100 at which a fault is generated, etc. The system status may be checked by the system status check module SSCM.

In step S840, the host device 20 may select a recovery scheme. For example, the host device 20 may select one of the one or more recovery schemes provided in operation S820. For example, the host device 20 may select a recovery scheme based on the fault information, the prediction information, and the system status. For example, when a call frequency of the host device 20 or an access frequency to the storage device 100 is high, the host device 20 may select a recovery scheme having a short recovery time. When a system, to which the host device 20 belongs, needs a high speed, the host device 20 may select a recovery scheme in which a decrease of a speed is low. When a system, to which the host device 20 belongs, increases resource efficiency, the host device 20 may select a recovery scheme in which a capacity decrease is low. For example, when a status of the storage device 100 changes after the recovery operation, the host device 20 may select a recovery scheme capable of optimizing a resource of the computing device 10. The recovery scheme may be selected by the recovery decision module RDM. For example, a reference of the recovery decision module RDM for selecting the recovery scheme may be stored in the recovery decision module RDM and may be updated or set by an external device or a user of the host device 20.

In operation S850, the host device 20 may send the selected recovery scheme to the storage device 100. In an exemplary embodiment of the inventive concept, before sending the selected recovery scheme to the storage device 100, the host device 20 may backup data stored in the storage device 100. For example, in the case where data of a storage space, at which a fault of a low level is generated, is readable, the storage device 20 may read data of the storage space, at which the fault is generated, and may store the read data in a normal storage space of the storage device 100 or another storage medium. As another example, in the case where it is impossible to read data from a storage area due to a fault of a high level, the host device 20 may recover data by using a data recovery device such as redundant array of independent disks (RAID) and backup the recovered data.

Figure 11:
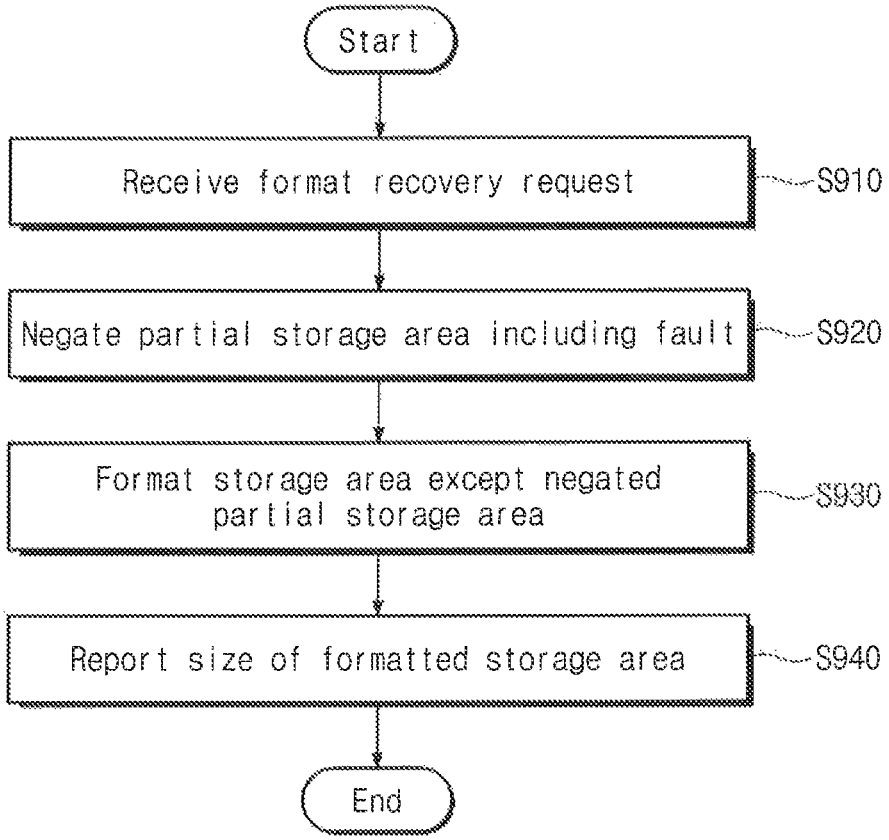
FIG. 11 illustrates a recovery operation performed at a host device and a storage device according to an exemplary embodiment of the inventive concept.

FIG. 11 illustrates a recovery operation is performed at the host device 20 and the storage device 100 according to an exemplary embodiment of the inventive concept. Referring to FIGS. 1 and 11, in step S910, the controller 120 may receive a format recovery request. For example, the recovery decision module RDM may select a format recovery scheme and send the format recovery request to the controller 120 based on the selected format recovery scheme. The recovery module RM may perform format recovery based on the received format recovery request.

In operation S920, the recovery module RM may negate a portion of a storage area corresponding to a recovery range included in the format recovery request, in other words, a portion of a storage area including a storage area at which a fault is generated. For example, under control of the recovery module RM, the memory management module MMM may release a mapping between logical addresses and physical addresses corresponding to the recovery range and mark the physical addresses in the recovery range as impossible to use.

In operation S930, the recovery module RM may format the remainder of the storage area other than the negated portion of the storage area. For example, under control of the recovery module RM, the memory management module MMM may update mapping information to indicate that valid data is not present in the remaining storage area.

In operation S940, the recovery module RM may report a size of the formatted storage area to the host device 20. The recovery completion module RCM may determine that valid data is not stored in the storage area of the storage device 100, change a size of the storage area of the storage device 100 into the reported size and modify or regenerate a file system associated with the storage device 100.

In an exemplary embodiment of the inventive concept, before format recovery is performed, the host device 20 may back up data stored in the remaining storage area of the storage device 100.

If the format recovery is performed, a range of logical addresses of the storage device 100 may be reduced, and logical addresses within the reduced range may be consecutive. The controller 120 may permit write, read, and erase operations with respect to the logical addresses, which belong to the range of the reduced logical addresses, without restriction.

Figure 12:
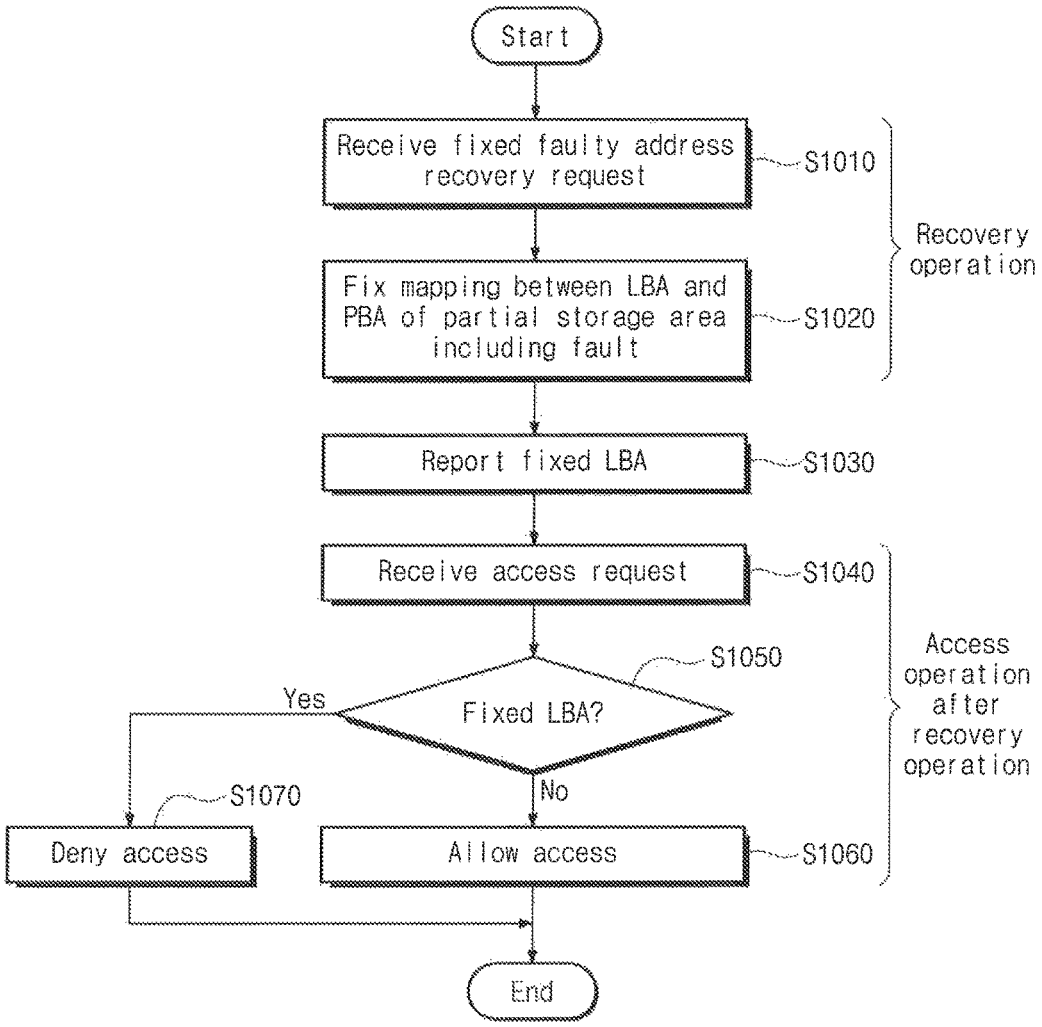
FIG. 12 illustrates a recovery operation performed at a host device and a storage device according to an exemplary embodiment of the inventive concept.

FIG. 12 illustrates a recovery operation performed at the host device 20 and the storage device 100 according to an exemplary embodiment of the inventive concept. Referring to FIGS. 1 and 12, in step S1010, the controller 120 may receive a fixed faulty address recovery request. For example, the recovery decision module RDM may select a fixed faulty address recovery scheme and send the fixed faulty address recovery request to the controller 120 based on the selected fixed faulty address recovery scheme. The recovery module RM may perform fixed faulty address recovery based on the selected fixed faulty address recovery request.

In operation S1020, the recovery module RM may negate a portion of a storage area corresponding to a recovery range included in the fixed faulty address recovery request, in other words, a portion of a storage area including a storage area at which a fault occurs. For example, under control of the recovery module RM, the memory management module MMM may fix mapping between logical addresses and physical addresses corresponding to the recovery range and create a list of fixed logical address LBA corresponding to the recovery range.

In operation S1030, the recovery module RM may report the list of the fixed logical addresses LBA to the host device 20 or internally manage the list of the fixed logical addresses LBA. The recovery completion module RCM may mark the reported logical address LBA as impossible to use. In an exemplary embodiment of the inventive concept, the list of the fixed logical address LBA may be managed by the storage device 100 or by both the storage device 100 and the host device 20.

Fixed faulty address recovery may be completed through operation S1010 to operation S1030. Afterwards, the host device 20 may normally access the storage device 100.

In operation S1040, the controller 120 may receive an access request from the host device 20. In operation S1050, the controller 120 may determine whether a logical address of the received access request is a fixed logical address. If the logical address of the received access request is not the fixed logical address, in operation S1060, the controller 120 may permit an access. If the logical address of the received access request corresponds to the fixed logical address, in operation S1070, the controller 120 may deny an access. For example, the controller 120 may send an error message to the host device 20.

As described above, if the fixed faulty address recovery is performed, a range of logical addresses of the storage device 100 may not be reduced but maintained. Within the range of logical addresses, the storage device 100 may deny an access to logical addresses at which a fault is generated and may permit write, read, and erase operations with respect to the remaining logical addresses without restriction.

Figure 13:
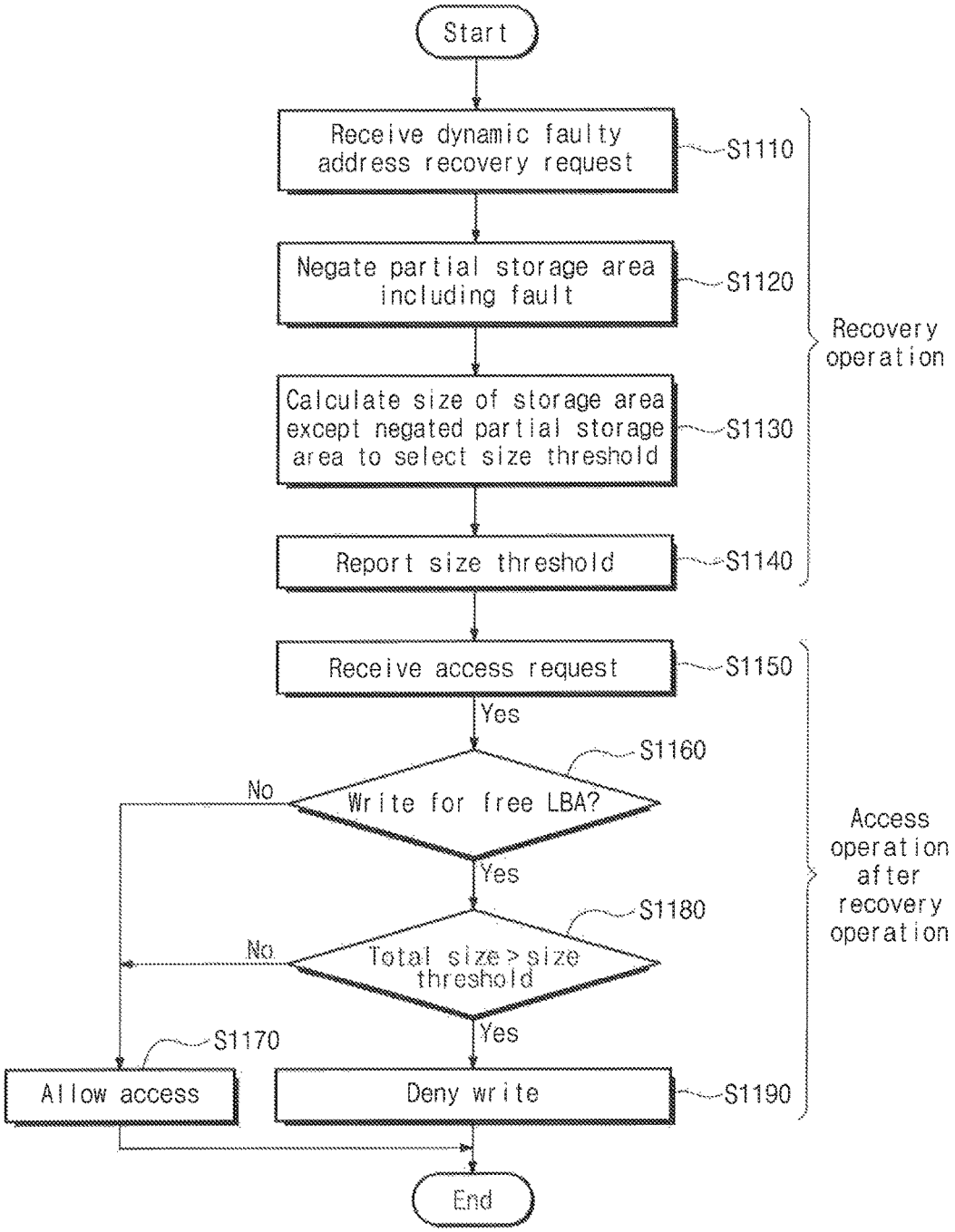
FIG. 13 illustrates a recovery operation performed at a host device and a storage device according to an exemplary embodiment of the inventive concept.

FIG. 13 illustrates a recovery operation performed at the host device 20 and the storage device 100 according to an exemplary embodiment of the inventive concept. Referring to FIGS. 1 and 13, in step S1110, the controller 120 may receive a dynamic faulty address recovery request. For example, the recovery decision module RDM may select a dynamic faulty address recovery scheme and send the dynamic faulty address recovery request to the controller 120 based on the selected dynamic faulty address recovery scheme. The recovery module RM may perform dynamic faulty address recovery based on the selected dynamic faulty address recovery request.

In operation S1120, the recovery module RM may negate a portion of a storage area corresponding to a recovery range included in the dynamic faulty address recovery request, in other words, a portion of a storage area including a storage area at which a fault is generated. For example, under control of the recovery module RM, the memory management module MMM may release a mapping between logical addresses and physical addresses corresponding to the recovery range and mark the physical addresses in the recovery range as impossible to use.

In operation S1130, the recovery module RM may compute the remainder of the storage area other than the negated portion of the storage area to select a size threshold. For example, the size threshold may be a size of the remaining storage area. For example, the size threshold may be set to indicate a reserved area, in consideration of parameters of the storage device 100 such as performance and life cycle. For example, a portion of the remaining storage area may be assigned to the reserved area. In the remaining storage area, a final storage area except for the reserved area may be set as the size threshold.

In operation S1140, the recovery module RM may report the computed size threshold to the host device 20. The recovery completion module RCM may recognize the received size threshold as the maximum value of data capable of being stored in the storage device 100.

The dynamic faulty address recovery may be completed through operation S1110 to operation S1140. Afterwards, the host device 20 may normally access the storage device 100.

In operation S1150, the controller 120 may receive an access request from the host device 20. In operation S1160, the controller 120 may determine whether the received access request is a write request for a free logical address LBA. If the received access request is not the write request for the free logical address LBA, in operation S1170, the controller 120 may allow an access. For example, read and update operations, which do not affect a size of data stored in the storage device 100, and an erase operation, which causes a decrease in a size of data stored in the storage device 100, may be permitted at the storage device 100 without restriction. If the received access request is the write request for the free logical address LBA, operation S1180 is performed.

In operation S1180, the controller 120 determines whether the total size of data previously stored in the storage device 100 and write-requested data is greater than the size threshold. If the total size is not greater than the size threshold, in operation S1170, the controller 120 may permit a write operation. If the total size is greater than the size threshold, in operation S1190, the controller 120 may deny a write request. For example, the controller 120 may send an error message to the host device 20.

As described above, if the dynamic faulty address recovery is performed, a range of logical addresses of the storage device 100 may be not reduced but maintained. As long as the total capacity of data written in the storage device 100 is less than or equal to the size threshold, the storage device 100 may permit write, read, and erase operations with respect to logical addresses within a range of logical addresses without restriction.

Figure 14:
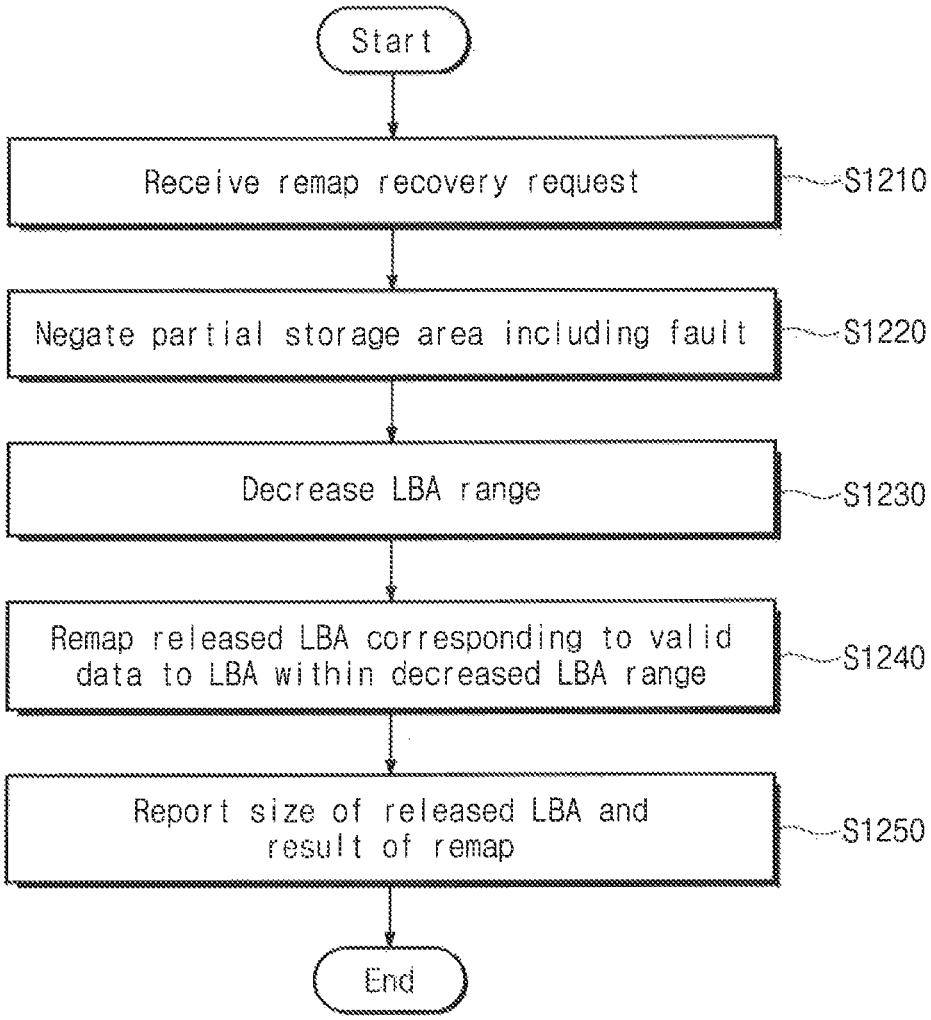
FIG. 14 illustrates a recovery operation performed at a host device and a storage device according to an exemplary embodiment of the inventive concept.

FIG. 14 illustrates a recovery operation performed at the host device 20 and the storage device 100 according to an exemplary embodiment of the inventive concept. Referring to FIGS. 1 and 14, in step S1210, the controller 120 may receive a remap recovery request. For example, the recovery decision module RDM may select a remap recovery scheme and send the remap recovery request to the controller 120 based on the selected remap recovery scheme. The recovery module RM may perform remap recovery based on the remap recovery request.

In operation S1220, the recovery module RM may negate a portion of a storage area corresponding to a recovery range included in the remap recovery request, in other words, a portion of a storage area including a storage area at which a fault is generated. For example, under control of the recovery module RM, the memory management module MMM may release a mapping between logical addresses and physical addresses corresponding to the recovery range and mark the physical addresses in the recovery range as impossible to use.

In operation S1230, the memory management module MMM may reduce a range of logical addresses LBA under control of the recovery module RM. For example, the memory management module MMM may reduce a maximum value of the logical addresses LBA by a size of a portion of a storage area.

In operation S1240, under control of the recovery module RM, the memory management module MMM may remap the released logical address LBA corresponding to valid data to a logical address LBA within a range of the reduced logical addresses LBA. For example, as the range of logical addresses LBA is reduced, some of the logical addresses LBA may be released such that they are not used. Valid data may be stored at some of the released logical addresses LBA. The memory management module MMM may remap a corresponding logical address to a free logical address within the reduced range of logical addresses LBA. For example, the memory management module MMM may update logical addresses LBA in mapping information between physical addresses PBA and logical addresses LBA.

In operation S1250, the recovery module RM may report a size of the released logical addresses LBA or the reduced range of logical addresses LBA to the host device 20. In addition, the recovery module RM may report the remapping result to the host device 20.

The recovery completion module RCM may change a range of logical addresses LBA in a file system of the storage device 100 and modify logical addresses of remapped data.

In an exemplary embodiment of the inventive concept, when a free logical address LBA to be remapped is insufficient, the recovery module RM may notify the host device 20 that a capacity is insufficient. The host device 20 may copy all or a part of data stored in the storage device 100 to the storage devices 30 and request the storage device 100 to continue recovery.

As described above, if the remap recovery is performed, a range of logical addresses of the storage device 100 may be reduced. Unlike the format recovery, data stored in the storage device 100 may be maintained.

In an exemplary embodiment of the inventive concept, the remapping of the reduced logical addresses LBA may be performed by the host device 20. When a fault is detected, the storage device 100 may notify the host device 20 that the fault is detected and inform the host device 20 that a capacity decreases according to a request (e.g., a recovery request) of the host device 20. The host device 20 may request information about the reduced range of logical addresses LBA from the storage device 100. The storage device 100 may send a range or list of faulty logical addresses LBA to the host device 20. The host device 20 may request the storage device 100 to unmap logical addresses LBA included in the range or list of faulty logical addresses LBA. The host device 20 may recover data stored at the unmapped logical addresses LBA by using a separate data recovery scheme, such as RAID. The recovered data may be written in a storage space within an updated range of logical addresses of the storage device 100, of which the capacity decreases, or in any other storage medium. In the case where data is previously written out of the updated range of logical addresses, the host device 20 may request the storage device 100 to remap a logical address of corresponding data within the updated range of logical addresses. Afterwards, the unmapping may be requested with respect to a logical address that leaves the updated range of logical addresses.

Figure 15:
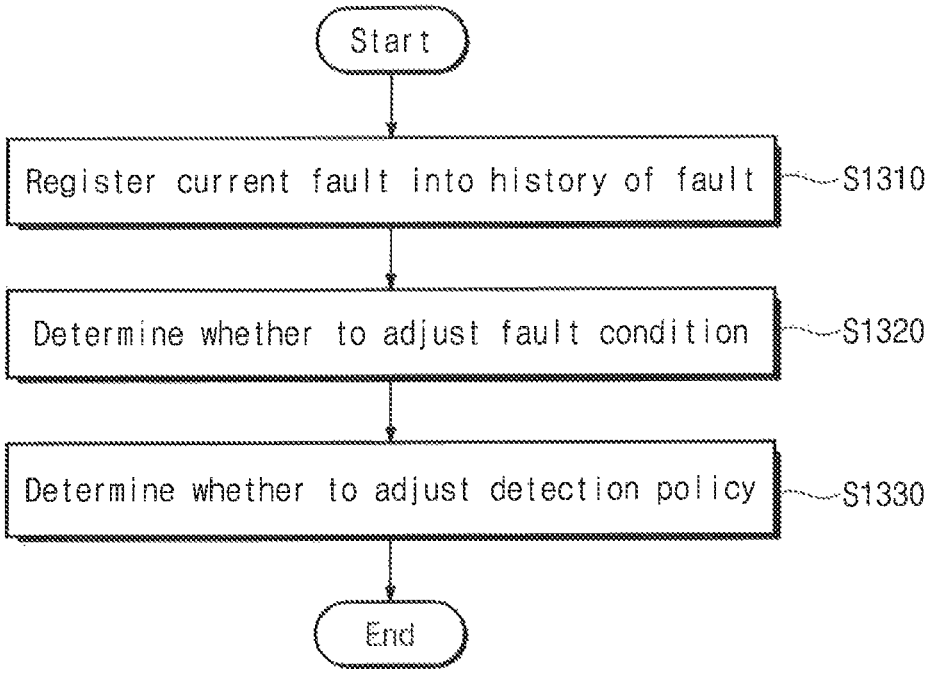
FIG. 15 illustrates a recovery operation performed at a host device and a storage device according to an exemplary embodiment of the inventive concept.

FIG. 15 illustrates a recovery operation completed at the host device 20 and the storage device 100 according to an exemplary embodiment of the inventive concept. Referring to FIGS. 1 and 15, in step S1310, the controller 120 may register a current fault in a fault history. The controller 120 may report the updated fault history to the host device 20.

In operation S1320, whether to adjust a fault condition may be determined based on the fault history. For example, the controller 120 may adjust the fault condition by itself or adjust the fault condition based on a request of the host device 20. For example, the fault condition may be adjusted according to the number of times that a fault is generated. For example, a physical storage space of the nonvolatile memory device 110 may be divided into zones, and a fault condition of each zone may be adjusted according to the number of times that a fault is generated at each zone. For example, the fault condition may be reinforced as the number of times that a fault is generated increases. For example, a threshold frequency of a program loop where a write fail is determined may decrease, a threshold frequency of an erase loop where an erase fail is determined may decrease, or a threshold time when a read fail is determined may decrease.

In operation S1330, whether to adjust a detection policy may be determined based on the fault history. For example, the controller 120 may adjust the fault policy by itself or adjust the fault policy based on a request of the host device 20. For example, the fault policy may be adjusted according to the number of times that a fault is generated. For example, a physical storage space of the nonvolatile memory device 110 may be divided into zones, and a fault policy of each zone may be adjusted according to the number of times that a fault is generated at each zone. For example, the number of enabled fault policies may increase as the number of times that a fault is generated increases.

Figure 16:
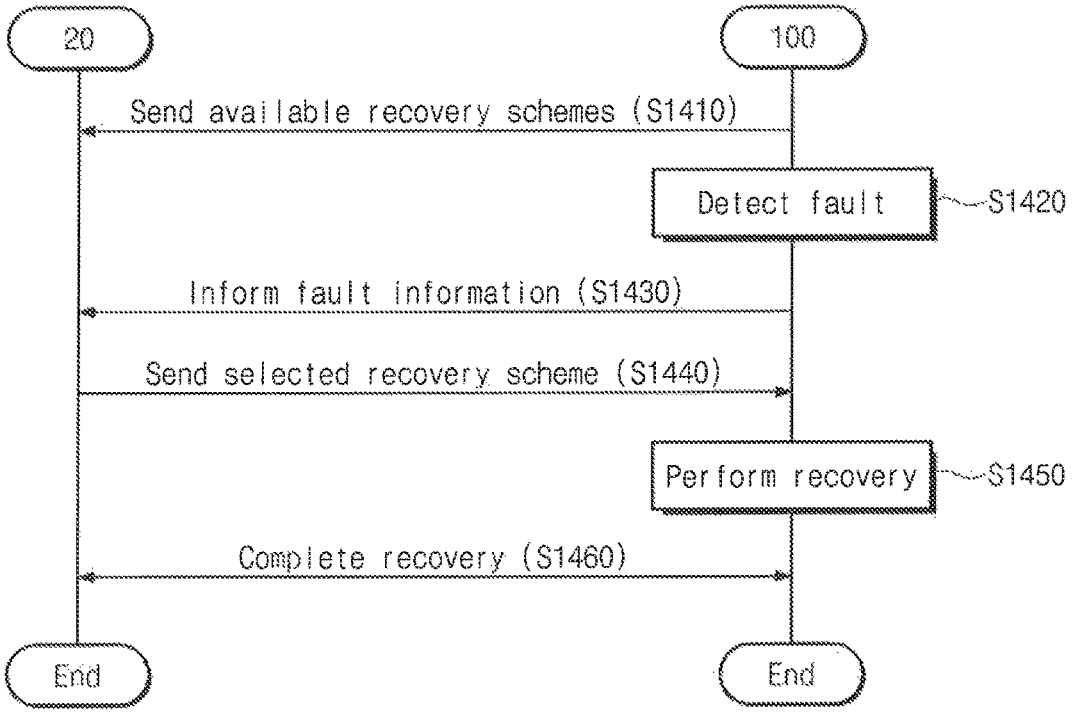
FIG. 16 is a flowchart illustrating an operating method of the computing device of FIG. 1 according to an exemplary embodiment of the inventive concept.

FIG. 16 is a flowchart illustrating an operating method of the computing device 10 of FIG. 1 according to an exemplary embodiment of the inventive concept. Referring to FIGS. 1 and 16, in operation S1410, the storage device 100, for example, the controller 120 may provide the host device 20 with available recovery schemes for recovering a fault. For example, the capability check module CCM may provide the host device 20 with one or more recovery schemes. For example, the available recovery schemes may be sent at power-on or according to a request of the host device 20.

In operation S1420, the storage device 100, for example, the controller 120 may detect a fault of the storage device 100, for example, a global fault.

In operation S1430, the storage device 100, for example, the controller 120 may notify the host device 20 of fault information. For example, the storage device 100 may provide the host device 20 with each recovery scheme and a speed variation, a capacity variation, or a recovery time of the storage device 100 according to each recovery scheme together with the fault information.

In operation S1440, the host device 20 may select one of the recovery schemes from the storage device 100. For example, the host device 20 may select a recovery scheme based on parameters associated with a recovery operation such as the amount of data to be recovered and a data recovery time or parameters associated with the storage device 100 such as a performance variation and a capacity variation of the storage device 100 after the recovery operation. The recovery decision module RDM may provide the selected recovery scheme to the storage device 100, for example, the controller 120.

In operation S1450, the storage device 100, for example, the controller 120 may perform a recovery operation based on the selected recovery scheme. For example, the host device 20 may write the recovered data in the storage device 100 or any other storage medium.

In operation S1460, the storage device 100 and the host device 20 may complete the recovery operation.

According to the operating method of FIG. 2, the storage device 100 may send available recovery schemes to the host device 20 when a fault is detected. In contrast, according to the operating method of FIG. 16, the storage device 100 may send available recovery schemes to the host device 20 before a fault is detected.

Figure 17:
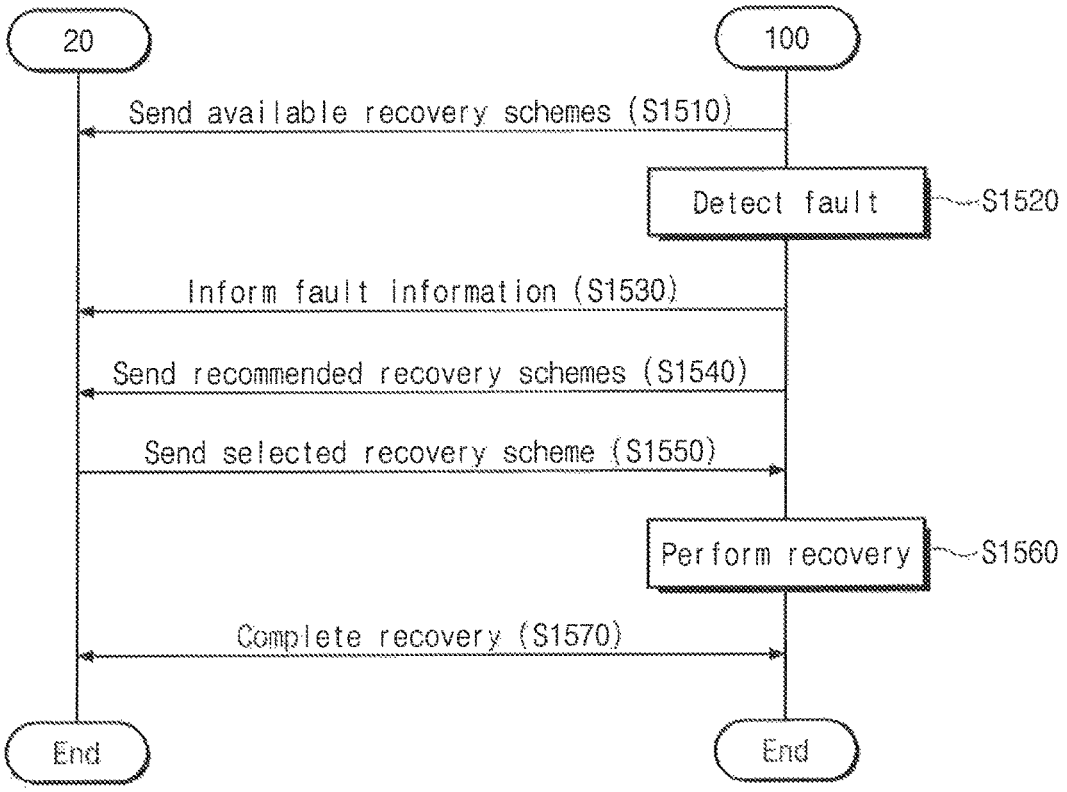
FIG. 17 is a flowchart illustrating an operating method of the computing device of FIG. 1 according to an exemplary embodiment of the inventive concept.

FIG. 17 is a flowchart illustrating an operating method of the computing device 10 of FIG. 1 according to an exemplary embodiment of the inventive concept. Referring to FIGS. 1 and 17, in operation S1510, the storage device 100, for example, the controller 120 may provide the host device 20 with available recovery schemes for recovering a fault. For example, the capability check module CCM may provide the host device 20 with one or more recovery schemes. For example, the available recovery schemes may be sent at power-on or according to a request of the host device 20.

In operation S1520, the storage device 100, for example, the controller 120 may detect a fault of the storage device 100, for example, a global fault.

In operation S1530, the storage device 100, for example, the controller 120 may notify the host device 20 of fault information.

In operation S1540, the storage device 100, for example, the controller 120 may send recommended recovery schemes to the host device 20. The number of recommended recovery schemes may be less than the number of recovery schemes sent in operation S1510. In addition, the storage device 100 may provide the host device 20 with each recovery scheme and a speed variation, a capacity variation, or a recovery time of the storage device 100 according to each recovery scheme.

In operation S1550, the host device 20 may select one of the recovery schemes from the storage device 100. For example, the host device 20 may select a recovery scheme based on parameters associated with a recovery operation such as the amount of data to be recovered and a data recovery time, or parameters associated with the storage device 100 such as a performance variation and a capacity variation of the storage device 100 after the recovery operation. The recovery decision module RDM may provide the selected recovery scheme to the storage device 100, for example, the controller 120. For example, the selected recovery scheme may be one of the recovery schemes recommended in operation S1540. For example, the selected recovery scheme may be a recovery scheme that belongs to the recovery schemes sent in operation S1510, not the recovery schemes recommended in operation S1540. For example, the host device 20 may select a recovery scheme, which is not recommended by the storage device 100, in consideration of a system status and fault information.

In operation S1560, the storage device 100, for example, the controller 120 may perform a recovery operation based on the selected recovery scheme. For example, the host device 20 may write the recovered data in the storage device 100 or any other storage medium.

In operation S1570, the storage device 100 and the host device 20 may complete the recovery operation.

In an exemplary embodiment of the inventive concept, a recovery operation of the storage device 100 may be performed according to a plurality of conditions when a size threshold is determined excluding a negated partial storage area. For example, the size threshold may be selected by computing a maximum value of a remaining storage area or by assigning a reserved area. For example, if the size threshold is maximally selected while the entire reserved area is used, a global fault may be generated immediately when a local fault is again generated. If the reserved area is assigned and the size threshold is computed, local faults generated after the recovery operation may be compensated for by the reserved area, thereby making it possible to delay a point in time when a global fault is generated. An area in which a life cycle, performance, or a percentage of stored valid data is the smallest may be selected from the remaining storage area as an area to be converted into the reserved area. Alternatively, reserved areas, which are previously converted into user data areas, may be again assigned back to reserved areas. In the case where a user data area, in which valid data is stored, is converted into a reserved area, the valid data may be moved to a free user data area. A reference for selecting a storage area, which is assigned to a reserved area, of the remaining storage area may be variously modified or changed without being limited to the above-described references.

For example, the size threshold may be determined by the host device 20, not the storage device 100. For example, the storage device 100 may notify the host device 20 that there is a need to change a size threshold due to the occurrence of a fault. For example, the storage device 100 may notify the host device 20 of the need to change the size threshold together with information about a size threshold computed by the storage device 100. The host device 20 may request the storage device 100 to accept the size threshold from the storage device 100 or to change the size threshold into a smaller (or greater) size.

For example, after the size threshold is determined, it may increase. For example, an abnormal operation may occur in the process of determining a fault. For example, a storage area, which causes a decrease in a size threshold of the storage device 100 as a consequence of determining that a fault is generated, may be determined later to operate normally. In this case, the size threshold may increase. In addition, when an overload or error transiently occurs at an interface connected between the nonvolatile memory chip NVC and the controller 120, it may be determined that the nonvolatile memory chip NVC does not respond. In this case, the size threshold may be reduced. Later, if the interface overload or error is solved, the nonvolatile memory chip NVC may respond normally to a control of the controller 120. In this case, the size threshold may increase. As described above, to monitor whether a detected fault is temporarily generated, fault detection may also be performed with respect to a storage area determined as a faulty storage area. For example, a storage area, which is determined as a faulty storage area after a predetermined detection frequency or a predetermined time elapses, may be designated as a permanent, faulty storage area. The fault detection for the storage area, which is designated as the permanent, faulty storage area, may be prohibited.

In an exemplary embodiment of the inventive concept, when a fault is detected at the storage device 100, data of a faulty storage area may have a plurality of states. For example, data of the faulty storage area may be data that is impossible to recover, in other words, is lost, or it may be data that is readable. The storage device 100 may provide logical addresses of the lost data to the host device 20, and the host device 20 may recover the lost data by using a recovery scheme used in the computing device 10, such as RAID. The storage device 100 may move readable data to a free user data area at which a fault does not occur and notify the host device 20 of a storage area, at which a fault is generated, as being readable. As the host device 20 recognizes that the storage area, at which a fault is generated, is readable, it may maintain data redundancy of the computing device 10 without modification and decrease the amount of data to be recovered and a recovery time. To secure the identity of redundancy of the computing device 10, the size threshold may be determined excluding a storage area at which readable data stored in a faulty storage area is stored. After data is completely recovered at the computing device 10, a storage area corresponding to the recovered data may be used as a reserved area.

In an exemplary embodiment of the inventive concept, in the case where the host device 20 is notified of a fault and information about a fault area from the storage device 100, as described with reference to FIGS. 12, 13, and 14, the host device 20 may retrieve information about a range or list of faulty logical addresses from the storage device 100. For fast data recovery, the host device 20 may separately request all readable data stored in the faulty storage area from the storage device 100. In this case, the host device 20 may request a read operation associated with a storage area of faulty logical addresses by using the previously notified range or list of logical addresses. For example, in the case where the faulty storage area includes a readable area and an unreadable area, the host device 20 may retrieve logical addresses of the readable, faulty storage area from the storage device 100 and request a read operation by using the retrieved logical addresses. In the case where logical addresses of the faulty storage area are randomly distributed over all logical addresses of the storage device 100, a random read operation may be performed with respect to the faulty storage area.

For example, the host device 20 may grasp a minimum value and a maximum value of logical addresses distributed over the faulty storage area and perform a sequential read operation with respect to data of a corresponding area. The storage device 10 may send sequentially read data including data of the faulty storage area to the host device 20. The storage device 10 may send the sequentially read data together with metadata information of the faulty storage area to the host device 20. The storage device 100 may support the host device 20 to determine whether a data fail occurs, by sending unreadable (or lost) data of the faulty storage area after replacing the unreadable data with a predefined value.

For example, the storage device 100 may perform a read operation of the faulty storage area on the basis of physical addresses instead of logical addresses. The storage device 100 may perform a sequential read by using physical addresses and send logical addresses of a lost storage area and a readable, faulty storage area together with data to the host device 20. The host device 20 may determine a faulty storage area based on data from the storage device 100. The host device 20 may store data read from the readable, faulty storage area in a normal storage area or any other storage medium.

In an exemplary embodiment of the inventive concept, if a detected fault is a global fault such as a state where it is impossible to access the buffer memory 130 or a failure of a tantalum capacitor, the storage device 100 may notify the host device 20 of the global fault. For example, in the case where the storage device 100 uses a policy in which a write operation is first performed with respect to the buffer memory 130 by using the buffer memory 130 and a write operation is then performed with respect to the nonvolatile memory chip NVC, the storage device 100 may notify the host device 120 that it is impossible to write the buffer memory 130 first due to an inaccessible state of the buffer memory 130. Afterwards, the storage device 100 may use a policy in which a write operation is performed with respect to the nonvolatile memory chip NVC directly without accessing the buffer memory 130. In this case, the storage device 100 may notify the host device 20 of information about a decrease in write performance. As another example, in the case where a global fault due to a failure of the tantalum capacitor is detected, the storage device 100 may notify the host device 20 of fault information. The host device 20 may control the storage device 100 such that data is directly written in the nonvolatile memory chips NVC when electric power is turned off.

Figure 18:
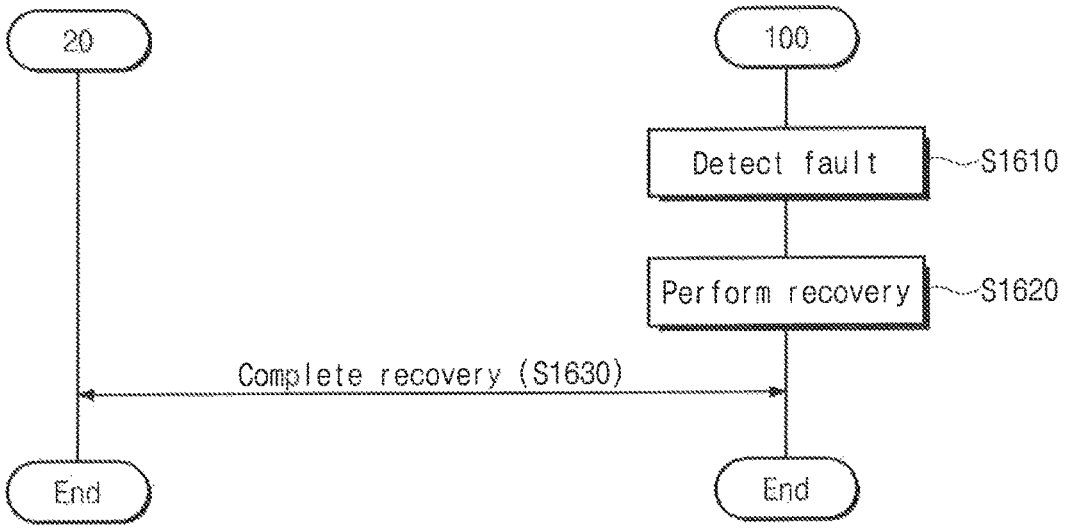
FIG. 18 is a flowchart illustrating an operating method of the computing device of FIG. 1 according to an exemplary embodiment of the inventive concept.

FIG. 18 is a flowchart illustrating an operating method of the computing device of FIG. 1 according to an exemplary embodiment of the inventive concept. Referring to FIGS. 1 and 18, in operation S1610, the storage device 100 may detect a fault. The operation S1610 may be performed similar to the operation S110 (of FIG. 2). If the fault is detected, the storage device 100 may perform a recovery operation itself (in operation S1620) without querying recovery methods to the host device 20.

For example, in operation S1620, the storage device 100 may select a format recovery method described referring to FIG. 11, a fixed faulty address recovery method described referring to FIG. 12, a dynamic faulty address recovery method described referring to FIG. 13, or a remap recovery method described referring to FIG. 14.

For example, in operation S1620, as described referring to FIG. 9, the storage device 100 may select a recovery method based on a type of the fault, a level of the fault, a size of a storage area of the fault, an address of the storage area of the fault, a physical characteristic of the storage area of the fault, or a history of the fault. The storage device 100 may perform the recovery operation according to the selected recovery method.

In operation S1630, the storage device 100 and the host device 20 may complete the recovery operation. For example, the storage device 100 may send information indicating a completion of the recovery operation and/or information that the host device 20 should know (e.g., a size of a formatted storage area, fixed logical addresses, a size threshold, a size of a released logical address and a result of the remap, etc.) to the host device 20.

In an exemplary embodiment of the inventive concept, the storage device 100 may manage information related to the recovery operation itself without sending it to the host device 20. In other words, the storage device 100 may not receive recovery-related information from the host device 20 after operation S1610 and during operation S1620. For example, the storage device 100 may send information (e.g., a signal) indicating that the storage device 100 cannot perform any exchanges with the host device 20 to the host device 20 during the recovery operation.

Figure 19:
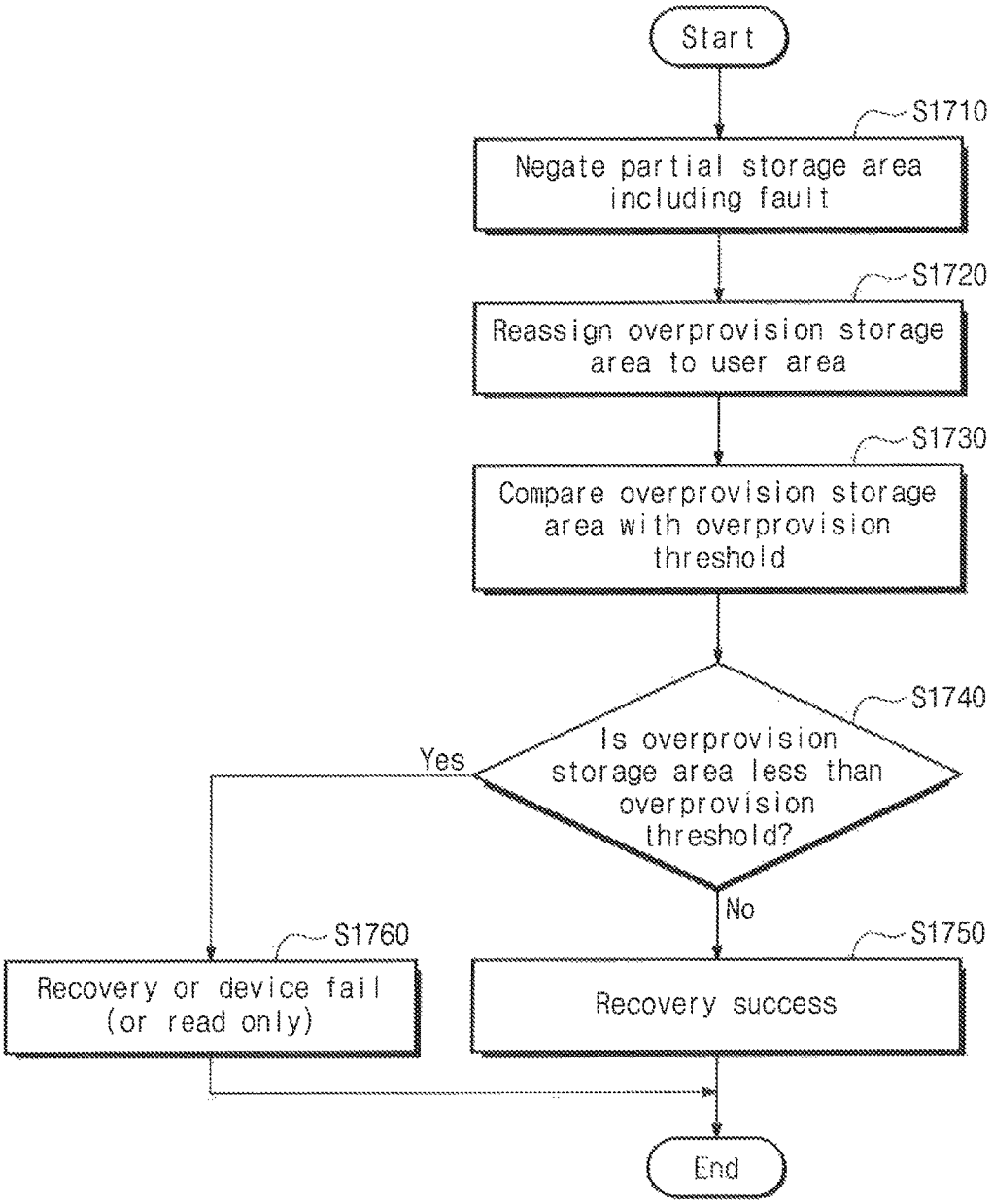
FIG. 19 illustrates recovery operations according to an exemplary embodiment of the inventive concept.

FIG. 19 illustrates recovery operations according to an exemplary embodiment of the inventive concept. Referring to FIGS. 1 and 19, in operation S1710, the storage device 100 may negate a partial storage area including a fault. For example, the storage device 100 may release a mapping between logical addresses and physical addresses corresponding to the partial storage area and mark the physical addresses in the partial storage area as impossible to use, or just not to be used.

In operation S1720, the storage device 100 may reassign a storage area corresponding to a size of the negated partial storage area in an overprovision storage area to a user area. For example, if the negated partial storage area includes a portion of the user area, the storage device 100 may perform the reassign. If the negated partial storage area does not include the portion of the user area, the storage device 100 may not perform the reassign.

After the reassign, in operation S1730, the storage device 100 may compare the overprovision storage area with an overprovision threshold. For example, the overprovision storage area may be a supplementary storage area provided to increase performance of the storage device 100. The overprovision storage area may be provided in addition to a size of total storage area (e.g., the user area) identified and accessed by the host device 20.

For example, the overprovision storage area may include the above-mentioned reserved area or may be included in addition to the above-mentioned reserved area. The overprovision storage area may be identical to the above-mentioned reserved area. The overprovision storage area may be separate from the above-mentioned reserved area. The user area may be a storage area which is addressed and accessed by an external host device, e.g., the host device 20.

For example, the storage device 100 may use the overprovision storage area for a swap of a wear leveling, a replacement of a bad block, etc. The overprovision threshold may be a value for preventing performance from dropping below a certain level. The overprovision threshold may be set by a manufacturer or a user of the storage device 100, or an external device such as the host device 20.

The overprovision threshold may be changed according to a frequency used by the host device 20 to access the storage device 100, an environment to which the computing device 10 belongs, or a type of data that the computing device 10 processes.

In operation S1740, if the overprovision storage area is not less than the overprovision threshold, the performance of the storage device 100 does not decrease under the certain level. In this case, in operation S1750, the storage device 100 may determine a recovery success. If the overprovision storage area is less than the overprovision threshold, the performance of the storage device 100 drops below the certain level. In this case, in operation S1760, the storage device 100 may determine a recovery or device fail. For example, the controller 120 may prohibit any access to the storage device 100 or control the storage device 100 to be used for read only operations.

In an exemplary embodiment of the inventive concept, as described referring to FIG. 19, the storage device 100 may compare the overprovision storage area with the overprovision threshold when performing the format recovery operation of FIG. 11, the fixed faulty address recovery operation of FIG. 12, the dynamic faulty address recovery operation of FIG. 13, or the remap recovery operation of FIG. 14. When a size of the overprovision storage area is equal to or greater than the overprovision threshold, the storage device 100 may replace a partial storage area including the fault with the overprovision storage area.

When the size of the overprovision storage area is less than the overprovision threshold, the storage device 100 may select the format recovery method of FIG. 11, the fixed faulty address recovery method of FIG. 12, the dynamic faulty address recovery method of FIG. 13, or the remap recovery method of FIG. 14.

The storage device 100 may reduce a total size of the storage area identified and accessed by the host device 20 and add the reduced storage area to the overprovision storage area using the selected recovery method. In other words, the storage device 100 may maintain the overprovision storage area to be equal to or greater than the overprovision threshold by reducing the storage area identified and accessed by the host device 20.

Figure 20:
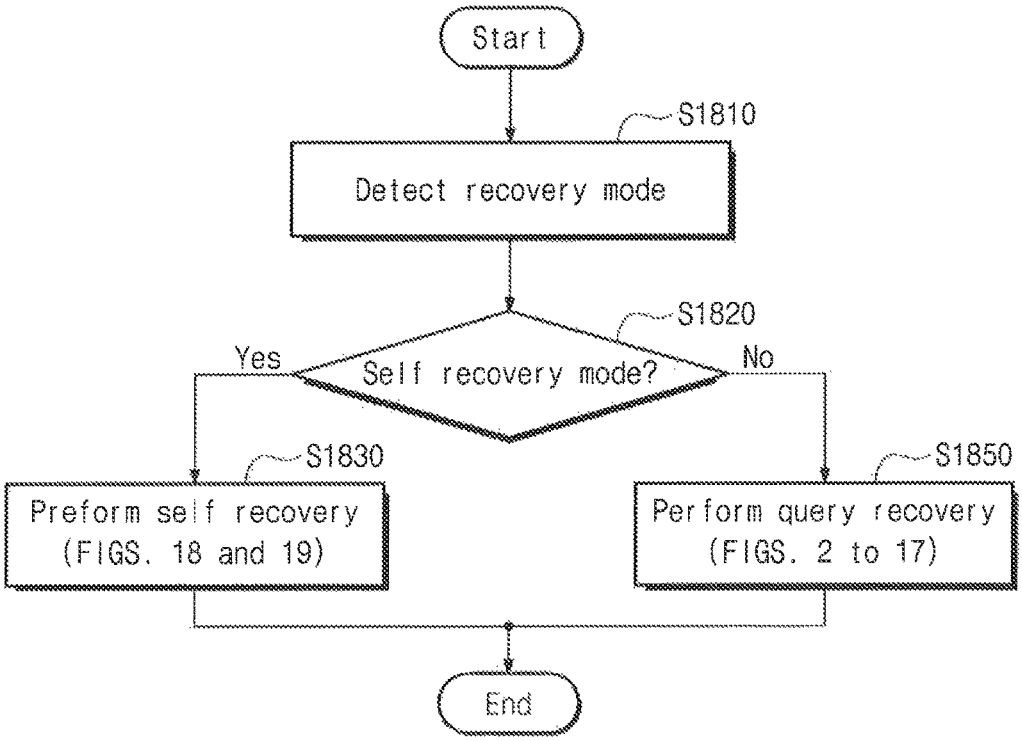
FIG. 20 illustrates a computing device operating in two modes according to an exemplary embodiment of the inventive concept.

FIG. 20 illustrates a computing device that operates in two modes according to an exemplary embodiment of the inventive concept. Referring to FIGS. 1 and 20, in operation S1810, the storage device 100 may detect a recovery mode upon detecting a fault. The recovery mode may be set by a manufacturer or a user of the storage device 100, or an external device such as the host device 20.

In operation S1820, the storage device 100 may determine whether the recovery mode is a self-recovery mode (e.g., a first recovery mode). If the recovery mode is the self-recovery mode, in operation S1830, the storage device 100 may perform a recovery operation as described referring to FIGS. 18 and 19. If the recovery mode is not the self-recovery mode, in other words, if the recovery mode is a query recovery mode (e.g., a second recovery mode), the storage device (100) may query a recovery method to the host device 20 as described referring to FIGS. 2 to 17. The query recovery occurs in operation S1850.

Alternately, the storage device 100 may be set to be in the self-recovery mode initially. In the self-recovery mode, a device fail occurs when the overprovision storage area is less than the overprovision threshold. If the device fail occurs, the storage device 100 may enter the query recovery mode. In the query recovery mode, the storage device 100 may recover the device fail by reducing the storage area identified and accessed by the host device 20.

Figure 21:
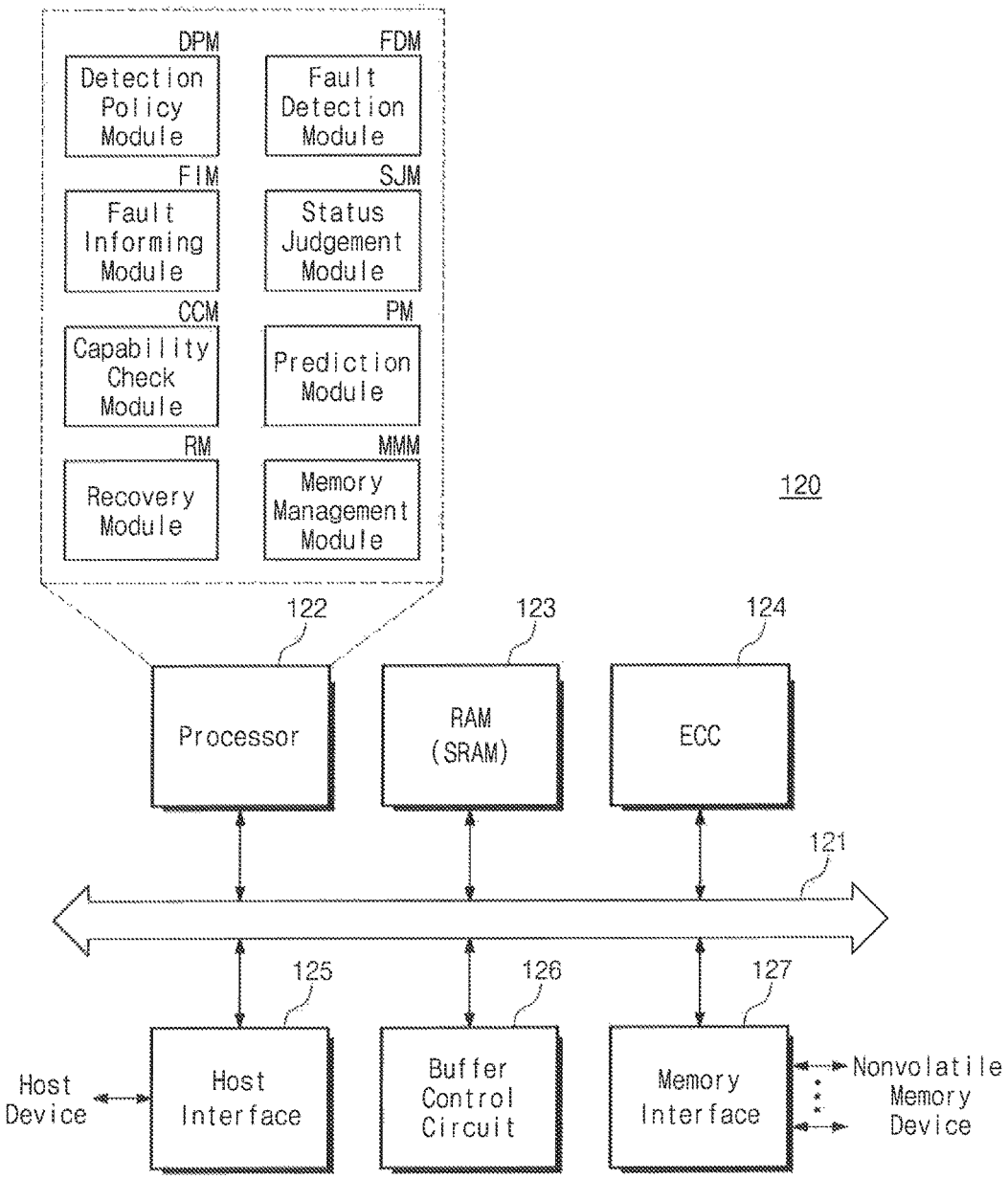
FIG. 21 is a block diagram illustrating a controller according to an exemplary embodiment of the inventive concept.

FIG. 21 is a block diagram illustrating the controller 120 according to an exemplary embodiment of the inventive concept. Referring to FIGS. 1 and 21, the controller 120 includes a bus 121, a processor 122, a RAM 123, an error correction block (or ECC) 124, a host interface 125, a buffer control circuit 126, and a memory interface 127.

The bus 121 is configured to provide a channel among elements of the controller 120. In other words, a path through which the elements of the controller 120 may communicate with one another.

The processor 122 may control overall operations of the controller 120 and execute a logical operation. The processor 122 may communicate with the external host device 20 through the host interface 125, communicate with the nonvolatile memory device 110 through the memory interface 127, and communicate with the RAM 130 through the buffer control circuit 126. The processor 122 may control the storage device 100 by using the RAM 123 as a working memory, a cache memory, or a buffer memory.

The processor 122 may include the detection policy module DPM, the fault detection module FDM, the fault informing module FIM, the status judgment module SJM, the capability check module CCM, the prediction module PM, the recovery module RM, and the memory management module MMM. For example, each of the detection policy module DPM, the fault detection module FDM, the fault informing module FIM, the status judgment module SJM, the capability check module CCM, the prediction module PM, the recovery module RM, and the memory management module MMM may be implemented in the form of hardware or intellectual property (IP) as a part of the processor 122 or may be implemented by firmware or software driven on the processor 122.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include a static random access memory (SRAM).

The error correction block 124 may perform an error correction operation. The error correction block 124 may perform error correction encoding based on data to be written in the nonvolatile memory device 110 through the memory interface 127. The error correction encoded data may be provided to the nonvolatile memory device 110 through the memory interface 127. The error correction block 124 may perform error correction decoding with respect to data received through the memory interface 127 from the nonvolatile memory device 110. In an exemplary embodiment of the inventive concept, the error correction block 124 may be included in the memory interface 127 as an element of the memory interface 127.

The host interface 125 is configured to communicate with the external host device 20 under control of the processor 122.

The buffer control circuit 126 is configured to control the RAM 130 under control of the processor 122

The memory interface 127 is configured to communicate with the nonvolatile memory device 110 in response to control of the processor 122. As described with reference to FIG. 1, the memory interface 127 may convey a command, an address, and data to the nonvolatile memory device 110 through the input/output channel. The memory interface 127 may convey a control signal to the nonvolatile memory device 110 through the control channel.

Figure 22:
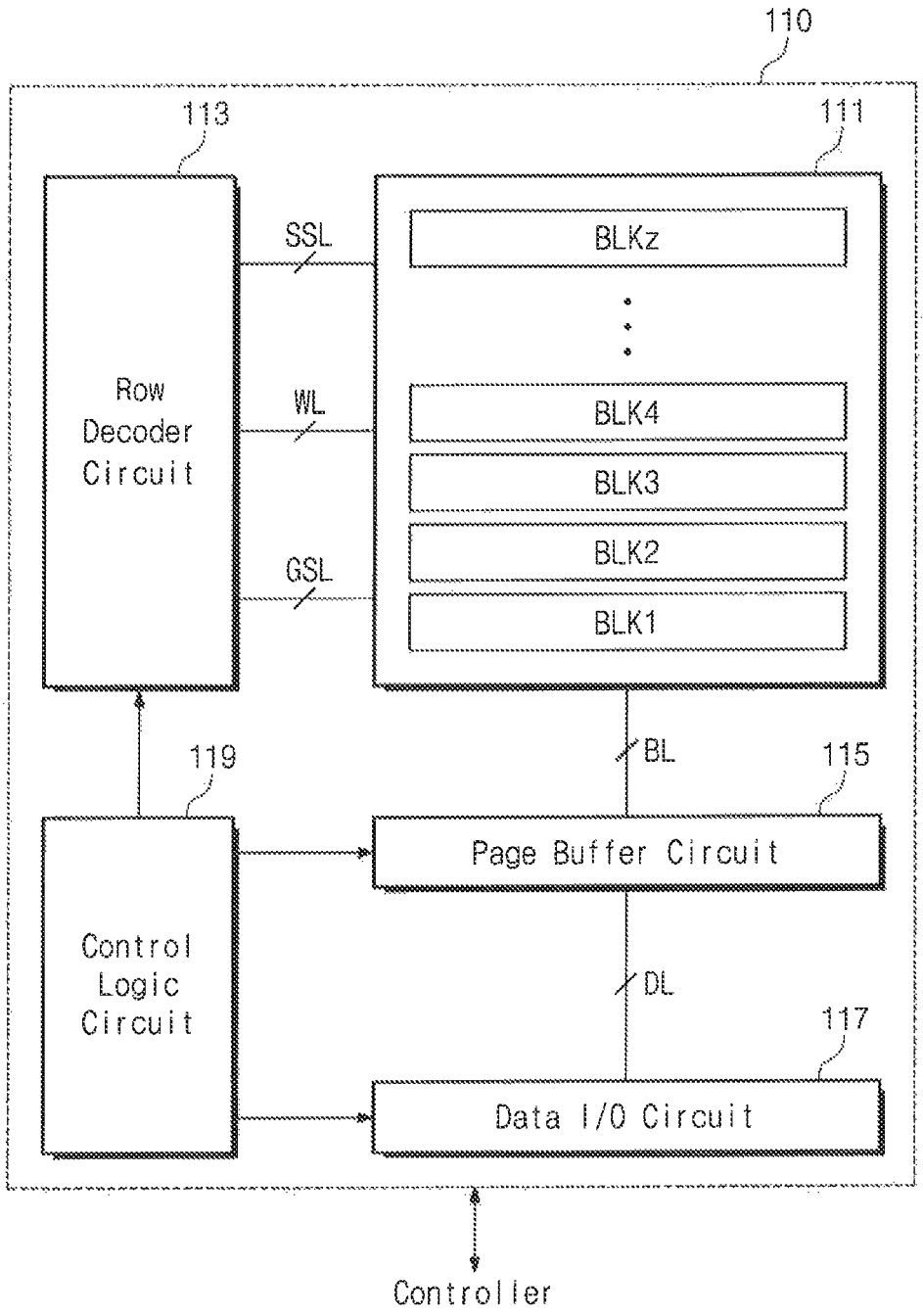
FIG. 22 is a block diagram illustrating a nonvolatile memory device according to an exemplary embodiment of the inventive concept.

FIG. 22 is a block diagram illustrating the nonvolatile memory device 110 according to an exemplary embodiment of the inventive concept. Referring to FIGS. 1 and 22, the nonvolatile memory device 110 includes a memory cell array 111, a row decoder circuit 113, a page buffer circuit 115, a data input/output (I/O) circuit 117, and a control logic circuit 119.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 113 through at least one string selection line SSL, a plurality of word lines WL, and at least one ground selection line GSL. Each of the memory blocks BLK1 to BLKz may be connected to the page buffer circuit 115 through a plurality of bit lines BL. The memory blocks BLK1 to BLKz may be connected in common to the bit lines BL. The memory cells in the memory blocks BLK1 to BLKz may have the same structure.

In an exemplary embodiment of the inventive concept, each of the memory blocks BLK1 to BLKz may be a unit of an erase operation. An erase operation of memory cells in the memory cell array 111 may be carried out in units of the memory blocks BLK1 to BLKz. The memory cells belonging to a memory block BLK may be erased at the same time.

In an exemplary embodiment of the inventive concept, each memory block BLK may be divided into a plurality of sub-blocks. Each of the sub-blocks may be an erase unit.

The row decoder circuit 113 is connected to the memory cell array 111 through a plurality of ground selection lines GSL, the plurality of word lines WL, and a plurality of string selection lines SSL. The row decoder circuit 113 operates according to control of the control logic circuit 119. The row decoder circuit 113 may decode an address received from the controller 120 through an I/O channel and perform voltage control with respect to the string selection lines SSL, the word lines WL, and the ground selection lines GSL based on the decoded address.

The page buffer circuit 115 is connected to the memory cell array 111 through the bit lines BL. The page buffer circuit 115 is connected to the data I/O circuit 117 through a plurality of data lines DL. The page buffer circuit 115 operates under control of the control logic circuit 119.

The data I/O circuit 117 is connected to the page buffer circuit 115 through the data lines DL. The data I/O circuit 117 may output data, which is read by the page buffer circuit 115, to the controller 120 through the I/O channel and may provide data, which is received from the controller 120 through the I/O channel, to the page buffer circuit 115.

The control logic circuit 119 may receive a command from the controller 120 through the I/O channel and receive a control signal from the controller 120 through a control channel. The control logic circuit 119 may receive a command, which is provided through the I/O channel, in response to the control signal, route an address, which is provided through the I/O channel, to the row decoder circuit 113, and route data, which is provided through the I/O channel, to the data I/O circuit 117. The control logic circuit 119 may decode the received command and control the nonvolatile memory device 110 based on the decoded command.

Figure 23:
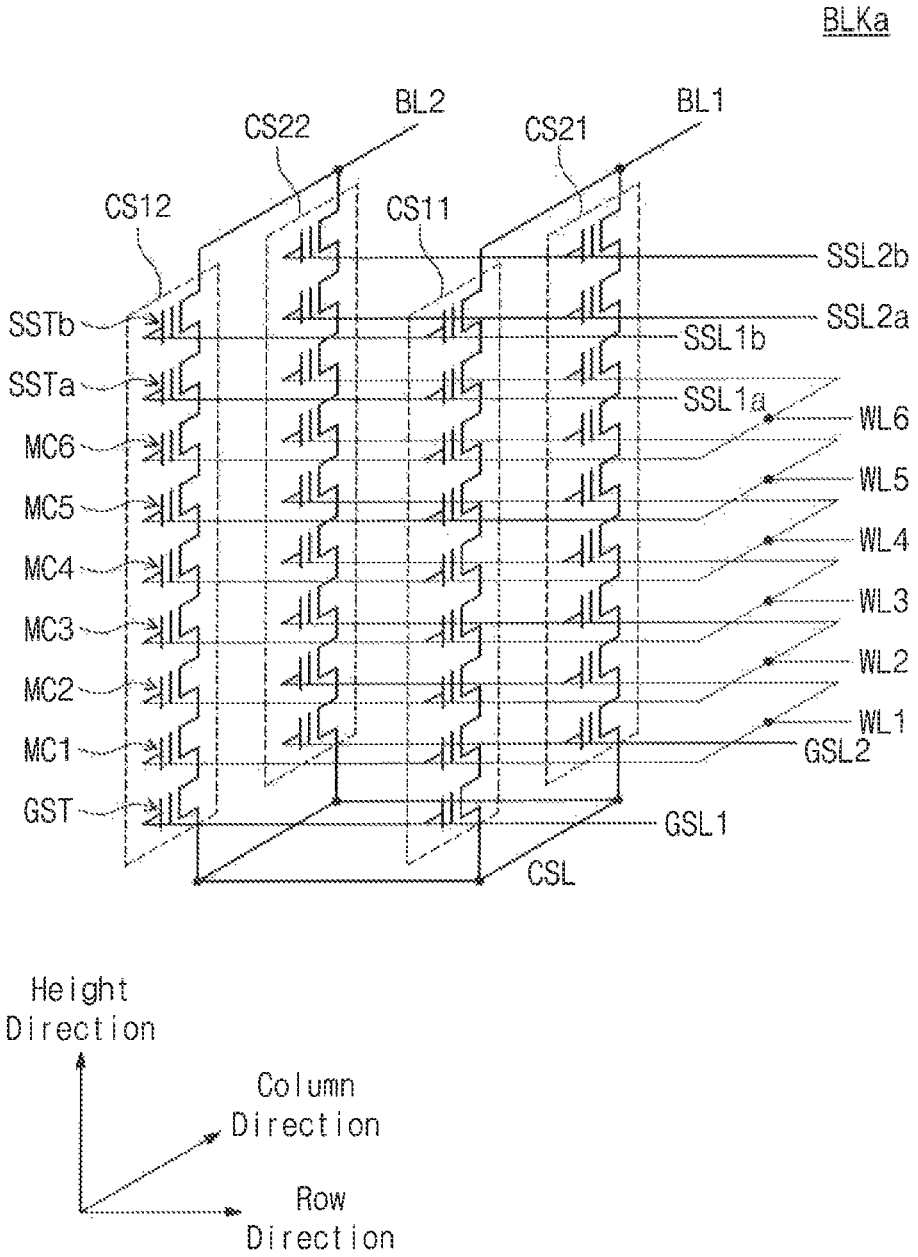
FIG. 23 is a circuit diagram illustrating a memory block according to an exemplary embodiment of the inventive concept.

FIG. 23 is a circuit diagram illustrating a memory block BLKa according to an exemplary embodiment of the inventive concept. Referring to FIG. 23, the memory block BLKa may include a plurality of cell strings CS11 to CS21 and CS12 to CS22. The cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string CS11 to CS21 and CS12 to CS22 may include a plurality of cell transistors. The cell transistors may include a ground selection transistor GST, memory cells MC1 to MC6, and string selection transistors SSTa and SSTb. The ground selection transistor GST, the memory cells MC1 to MC6, and the string selection transistors SSTa and SSTb in each cell string CS11 to CS21 and CS12 to CS22 may be stacked in a height direction perpendicular to a plane (e.g., a plane on a substrate of the memory block BLKa) on which the cell strings CS11 to CS21 and CS12 to CS22 are arranged along the rows and the columns.

The cell transistors may be charge trap type cell transistors of which the threshold voltages vary according to the amount of charges trapped in an insulating layer thereof.

Sources of the lowermost ground selection transistors GST may be connected in common to a common source line CSL.

Control gates of ground selection transistors GST of the cell strings CS11 and CS12 in a first row may be connected in common to a ground selection line GSL1, and control gates of ground selection transistors GST of the cell strings CS21 and CS22 in a second row may be connected in common to a ground selection line GSL2. In other words, cell strings in different rows may be connected to different ground selection lines.

Control gates of memory cells that are placed at the same height (or order) from the substrate (or the ground selection transistors GST) are connected in common to a word line. Control gates of memory cells that are placed at different heights (or, orders) are connected to different word lines WL1 to WL6. For example, the memory cells MC1 are connected in common to a word line WL1. The memory cells MC2 are connected in common to a word line WL2. The memory cells MC3 are connected in common to a word line WL3. The memory cells MC4 are connected in common to a word line WL4. The memory cells MC5 are connected in common to a word line WL5. The memory cells MC6 are connected in common to a word line WL6.

In other words, cell strings in different rows are connected to different string selection lines. String selection transistors of cell strings in the same row, which have the same height (or order), are connected to the same string selection line. String selection transistors of cell strings in the same row, which have different heights (or orders), are connected to different string selection lines. For example, string selection transistors SSTa may be connected to string selection line SSL1a and string selection transistors SSTb may be connected to string selection line SSL1b. Other string selection transistors of other cell strings may be connected to string selection lines SSL2a and SSL2b, for example, As described above, the memory block BLKa may be provided at a three-dimensional (3D) memory array. The 3D memory array is monolithically formed in one or more physical levels of arrays of memory cells MC1 to MC6 having an active area disposed above a silicon substrate and a circuitry associated with the operation of those memory cells MC1 to MC6. The circuitry associated with an operation of the memory cells MC1 to MC6 may be located above or within such substrate. The term "monolithic" may mean that layers of each level of the array are directly deposited on the layers of each underlying level of the 3D memory array.

In an exemplary embodiment of the inventive concept, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC1 to MC6. The at least one selection transistor may have the same structure as the memory cells MC1 to MC6 and may be formed uniformly with the memory cells MC1 to MC6.

The following patent documents, which are incorporated by reference herein in their entireties, describe configurations of 3D memory arrays, in which the 3D memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

According to exemplary embodiments of the inventive concept, if reserved blocks are all used or a fault is generated due to a failure of other parts at a partial storage space, a storage device may be operated by using the remaining storage space other than the storage space at which the fault is generated. Accordingly, even though the fault is generated, the storage device may not enter an unusable state. Accordingly, an operating method of a storage device and a computing device including the storage device and a host device are provided to increase a life cycle of a storage device.

While the inventive concept has been described with reference to exemplary embodiments thereof, it will be apparent to those skilled in the art that various changes and modifications may be made thereto without departing from the spirit and scope of the inventive concept. Therefore, it should be understood that the above embodiments are not limiting, but illustrative.

What is claimed is:

[1. A storage device, comprising:

a nonvolatile memory device including a plurality of nonvolatile memory cells forming a user area and an overprovision storage area; and a controller configured to control the nonvolatile memory device, wherein when the controller detects a fault of the nonvolatile memory device, the controller negates a partial storage area including the fault in the nonvolatile memory device, reassigns a partial overprovision storage area corresponding to a size of a partial user area among the partial storage area to the user area, determines a device fail if a size of the overprovision storage area is less than an overprovision threshold after the reassigning of the partial overprovision storage area, and determines a recovery success if the size of the overprovision storage area is equal to or greater than the overprovision threshold after the reassigning of the partial overprovision storage area, wherein the controller is configured to use the overprovision storage area to increase performance of the storage area and to set the overprovision threshold to prevent the performance from dropping below a certain level, wherein the controller controls the storage device to be used for a read only operation having the performance of the certain level if the device fail is determined.]

[2. The storage device of claim 1, wherein the controller prohibits an access to the storage device if the device fail is determined.]

[3. The storage device of claim 1, wherein the overprovision storage area is a supplemental storage area which is not accessed by an external device.]

[4. The storage device of claim 1, wherein the controller uses the overprovision storage area for a swap of a wear leveling or a replacement of a bad block.]

5. A storage device, comprising:

a nonvolatile memory device including a plurality of nonvolatile memory cells; and a controller configured to control the nonvolatile memory device, wherein when the controller detects a fault of the nonvolatile memory device, the controller selects a recovery method among a plurality of recovery methods, and recovers the fault using the selected recovery method, wherein the selected recovery method negates a partial storage area including the fault, wherein the controller calculates a size of a remaining storage area except the partial storage area, determines the size of the remaining storage area as a size threshold, and prevents writes to the storage device that exceed the size threshold.

6. The storage device of claim 5, wherein the controller selects the recovery method based on a type of the fault, a level of the fault, a size of a storage area including the fault, an address of the storage area including the fault, or a history associated with the fault.

7. The storage device of claim 5, wherein the controller formats the remaining storage area except the partial storage area.

8. The storage device of claim 5, wherein the controller reassigns a partial overprovision storage area corresponding to a size of a partial user area among the partial storage area to a user area, determines a device fail if a size of an overprovision storage area is less than an overprovision threshold after the reassigning, and determines a recovery success if the size of the overprovision storage area is equal to or greater than the overprovision threshold after the reassigning.

9. The storage device of claim 5, wherein the controller reduces a logical address range by as much as the partial storage area, and remaps a logical address, which corresponds to a valid data and is released from the logical address range, to another logical address belonging to the reduced logical address range.

10. The storage device of claim 5, wherein the recovery methods include fixing a mapping between a physical address and a logical address corresponding to the partial storage area, and preventing an access to the fixed addresses.

11. The storage device of claim 5, wherein the controller sends, to a host, information of the fault, information of the selected recovery method, or information of a result of a recovery operation using the selected recovery method.

12. A storage device, comprising:

a nonvolatile memory device including a plurality of nonvolatile memory cells; and a controller configured to control the nonvolatile memory device, wherein when the controller detects a fault of the nonvolatile memory device, the controller detects a recovery mode upon detecting the fault, selects a recovery method and performs a recovery of the fault itself if the recovery mode is a first recovery mode, and recommends *a plurality of* available recovery methods to an external host device if the recovery mode is a second recovery mode,

*wherein, in the first recovery mode, the controller negates a partial storage area including the fault,*

*wherein the controller calculates a size of a remaining storage area except the partial storage area, determines the size of the remaining storage area as a size threshold, and prevents writes to the storage device that exceed the size threshold.*

13. The storage device of claim 12, wherein, in the first recovery mode, the controller selects the recovery method among [a] *the* plurality of recovery methods to recover the fault.

14. The storage device of claim 12, wherein, in the first recovery mode, the controller [negates a partial storage area including the fault,] reassigns a partial overprovision storage area corresponding to a size of a partial user area among the partial storage area to a user area, determines a device fail if a size of an overprovision storage area is less than an overprovision threshold after reassigning the partial overprovision storage area, and determines a recovery success if the size of the overprovision storage area is equal to or greater than the overprovision threshold after the reassigning.

15. The storage device of claim 12, wherein the recovery mode is set according to an external control.

16. The storage device of claim 12, wherein an initial setting of the recovery mode is the first recovery mode, and wherein the controller enters the second recovery mode if a device fail occurs in the first recovery mode.

* * * * *